United States Patent
Watanabe et al.

(10) Patent No.: US 7,468,236 B2
(45) Date of Patent: Dec. 23, 2008

(54) AMINE COMPOUND, CHEMICALLY AMPLIFIED RESIST COMPOSITION AND PATTERNING PROCESS

(75) Inventors: Takeru Watanabe, Joetsu (JP); Jun Hatakeyama, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 11/543,833

(22) Filed: Oct. 6, 2006

(65) Prior Publication Data

US 2007/0087287 A1 Apr. 19, 2007

(30) Foreign Application Priority Data

Oct. 14, 2005 (JP) ............................. 2005-299558

(51) Int. Cl.
*G03C 1/73* (2006.01)
*G03C 1/00* (2006.01)

(52) U.S. Cl. ................. 430/270.1; 430/281.1; 549/432; 549/436

(58) Field of Classification Search ............. 430/270.1, 430/281.1; 427/384; 510/175, 276
See application file for complete search history.

(56) References Cited

U.S. PATENT DOCUMENTS

| | | | |
|---|---|---|---|
| 4,491,628 A | 1/1985 | Ito et al. | |
| 5,310,619 A | 5/1994 | Crivello et al. | |
| 5,714,625 A | 2/1998 | Hada et al. | |
| 5,744,281 A | 4/1998 | Niki et al. | |
| 6,004,724 A | 12/1999 | Yamato et al. | |
| 6,063,953 A | 5/2000 | Hada et al. | |
| 6,261,738 B1 | 7/2001 | Asakura et al. | |
| 6,749,988 B2 | 6/2004 | Hatakeyama et al. | |
| 6,916,591 B2 | 7/2005 | Ohsawa et al. | |
| 6,953,606 B2 * | 10/2005 | Behr et al. | 427/384 |
| 2002/0058201 A1 * | 5/2002 | Miyaji et al. | 430/270.1 |

FOREIGN PATENT DOCUMENTS

| | | | |
|---|---|---|---|
| GB | 1412477 A * | 11/1975 |
| JP | 63-27829 A | 2/1988 |
| JP | 02-027660 B2 | 1/1990 |
| JP | 5-232706 A | 9/1993 |
| JP | 7-134419 A | 5/1995 |
| JP | 9-95479 A | 4/1997 |
| JP | 9-208554 A | 8/1997 |
| JP | 9-230588 A | 9/1997 |
| JP | 09-301948 A | 11/1997 |
| JP | 2906999 B2 | 4/1999 |
| JP | 2000-314956 A | 11/2000 |
| JP | 2002-226470 A | 8/2002 |
| JP | 2006251672 A * | 9/2006 |
| WO | WO-2004/074242 | 9/2004 |

OTHER PUBLICATIONS

W. Hinsberg et al., Journal of Photopolymer Science and Technology, vol. 6, No. 4, 535-546 (1993).
T. Kumada et al., Journal of Photopolymer Science and Technology, vol. 6, No. 4 571-574 (1993).
Hatekeyama et al. in Journal of Photopolymer Science and Technology, vol. 13, No. 4 pp. 519-524 (2000).
K. Arimitsu et al., Journal of Photopolymer Science and Technology, vol. 8, No. 1, pp. 43-44, (1995).
K. Arimitsu et al., Journal of Photopolymer Science and Technology, vol. 8, No. 1, pp. 45-46 (1995).
K. Arimitsu et al., Journal of Photopolymer Science and Technology, vol. 9, No. 1, pp. 29-30 (1996).

* cited by examiner

*Primary Examiner*—Cynthia H Kelly
*Assistant Examiner*—Ponder N Thompson Rummel
(74) *Attorney, Agent, or Firm*—Birch, Stewart, Kolasch & Birch, LLP

(57) ABSTRACT

Chemically amplified resist compositions comprising amine compounds having a fluorinated alkyl group offer an excellent resolution and a precise pattern profile and are useful in microfabrication by KrF, ArF, $F_2$, EUV, EB or X-ray lithography. They are also effective in the immersion lithography.

5 Claims, No Drawings

AMINE COMPOUND, CHEMICALLY AMPLIFIED RESIST COMPOSITION AND PATTERNING PROCESS

CROSS-REFERENCE TO RELATED APPLICATION

This non-provisional application claims priority under 35 U.S.C. §119(a) on Patent Application No. 2005-299558 filed in Japan on Oct. 14, 2005, the entire contents of which are hereby incorporated by reference.

TECHNICAL FIELD

The present invention relates to a novel amine compound having a specific structure, a chemically amplified resist composition comprising the same and suitable for microfabrication technology, and a patterning process using the resist composition.

BACKGROUND ART

Of the efforts currently being made to achieve a finer pattern rule in the drive for higher integration and operating speeds in LSI devices, deep-ultraviolet lithography is thought to hold particular promise as the microfabrication technology and has already been employed in practice. Deep-UV lithography is capable of fabrication to dimensions of 0.2 μm or less and, when a resist having low light absorption is used, can form patterns with sidewalls that are nearly perpendicular to the substrate. One technology that has attracted a good deal of attention recently utilizes high-intensity KrF and ArF excimer lasers as the deep-UV light source. This technology is being used in mass-scale production, prompting a desire for resists having a low light absorption and a high sensitivity.

Acid-catalyzed chemical amplification resists (e.g., U.S. Pat. Nos. 4,491,628 and 5,310,619, or JP-B 2-27660 and JP-A 63-27829) developed in response to the above needs are endowed with excellent properties, including a high sensitivity, high resolution and good dry-etching resistance, which make them especially promising as resists for deep-UV lithography.

However, one problem with chemically amplified resists is that, when the standing time from exposure to post exposure bake (PEB) is long, the line pattern formed during patterning acquires a "T-top" profile characterized by widening at the top of the pattern. This defect is called "post exposure delay" (PED). Another problem with such resists is "footing," which is a widening of the resist pattern close to the substrate that occurs on a basic substrate, particularly a silicon nitride or titanium nitride substrate. The T-top effect is believed to result from a decrease in solubility at the surface of the resist film, and the footing effect at the substrate surface appears to arise from a decline in solubility near the substrate. An additional problem is that acid-labile group elimination is a dark reaction which proceeds during the interval between the exposure step and the PEB step, reducing the final dimensions of the pattern lines. These problems represent major drawbacks to the practical use of chemically amplified resists. Because of such defects, prior-art chemically amplified resists are difficult to control dimensions in the lithographic process. Dimensional control is also lost during dry etching of the substrate. See, for example, W. Hinsberg et al., Journal of Photopolymer Science and Technology, Vol. 6, No. 4, 535-546 (1993); and T. Kumada et al., ibid., 571-574.

In chemically amplified resists, the problems of PED and footing on the substrate surface are believed to be caused in large part by basic compounds which are either airborne or present on the surface of the substrate. The acid at the surface of the resist film that has been generated by exposure reacts with airborne bases and is deactivated. Prolonged standing until post-exposure bake results in a corresponding increase in the amount of deactivated acid, making it more difficult for the acid-labile groups to decompose. A substantially insolubilized layer thus forms at the surface, giving the resist pattern a T-top profile.

It is well-known in the art that the addition of a nitrogen-containing compound can check the influence of airborne bases, and is thus effective also against PED (see, for example, JP-A 5-232706 and JP-A 7-134419). Familiar nitrogen-containing compounds having significant addition effects include amine compounds and amide compounds. Specific examples include pyridine, polyvinylpyridine, aniline, N-methylaniline, N,N-dimethylaniline, o-toluidine, m-toluidine, p-toluidine, 2,4-lutidine, quinoline, isoquinoline, formamide, N-methylformamide, N,N-dimethylformamide, acetamide, N-methylacetamide, N,N-dimethylacetamide, 2-pyrrolidone, N-methylpyrrolidone, imidazole, α-picoline, β-picoline, γ-picoline, o-aminobenzoic acid, m-aminobenzoic acid, p-aminobenzoic acid, 1,2-phenylenediamine, 1,3-phenylenediamine, 1,4-phenylenediamine, 2-quinolinecarboxylic acid, 2-amino-4-nitrophenol, and 2-(p-chlorophenyl)-4,6-trichloromethyl-s-triazine.

These nitrogen-containing compounds are weak bases and can alleviate the T-top problem, but such compounds are unable to control the reaction when highly reactive acid-labile groups are used; that is, they cannot control acid diffusion fully. With the addition of a weak base, the dark reactions in PED in particular proceed in unexposed areas, causing slimming of the line dimensions and a loss of film thickness from the line surface (called top-loss) during PED. To overcome such problems, it is desirable to add a strong base. However, a higher basicity is not necessarily better. For example, good effects cannot be obtained with the addition of the following super-strong bases:

DBU (1,8-diazabicyclo[5.4.0]-7-undecene),
DBN (1,5-diazabicyclo[4.3.0]-5-nonene) and
proton sponge (1,8-bis(dimethylamino)naphthalene) or
quaternary ammonium hydroxides such as tetramethylammonium hydroxide.

The addition of a nitrogen-containing compound having an excellent generated acid kinetic capturing effect works well to increase the contrast and thereby achieve a high resolution. The dissociation constants of the acid and base within water can be explained in terms of pKa, but the acid kinetic capturing ability within the resist film is not directly related to the pKa of the nitrogen-containing compound. This is discussed by Hatakeyama et al. in Journal of Photopolymer Science and Technology, Vol. 13, No. 4, pp. 519-524 (2000). The structure of nitrogen-containing compounds capable of accomplishing a high resolution is described, for example, in JP-A 2002-226470.

In the current situation seeking for further miniaturization, there is a need to have resist compositions suitable for the immersion lithography as well. The ArF immersion lithography utilizes deionized water as the immersion solvent. The immersion lithography involves prebaking a resist film and exposing the resist film to light through a projection lens, with water interposed between the resist film and the projection lens. This technology, combined with a projection lens having a numerical aperture of at least 1.0, is important for the ArF lithography to survive to a node of 65 nm or less, with a further development thereof being accelerated. If the immersion lithography is applied to a resist composition comprising a water-soluble nitrogen-containing compound, part of the nitrogen-containing compound can be dissolved in the immersion water during exposure, undesirably resulting in a resist pattern with degraded rectangularity. There is a desire to have nitrogen-containing compounds which are low water soluble and capable of achieving a high resolution.

SUMMARY OF THE INVENTION

It is therefore an object of the invention to provide a chemically amplified resist composition which exhibits a high resolution and forms a precisely configured pattern, when processed by photolithography for micropatterning, especially lithography using a light source such as a KrF laser, ArF laser, $F_2$ laser, extremely short UV, electron beam or x-ray, and which is compatible with the immersion lithography. Another object of the invention is to provide a patterning process using the resist composition. A further object of the invention is to provide a novel amine compound suited for use in the resist composition.

In a first aspect, the invention provides a chemically amplified resist composition comprising at least one amine compound having a fluorinated alkyl group. This resist composition is little dissolved in water and thus suited for the immersion lithography.

In a second aspect, the invention provides a chemically amplified resist composition comprising at least one amine compound having a fluorinated alkyl group and a morpholine structure. This resist composition exhibits a high resolution and is little dissolved in water and thus suited for the immersion lithography.

In a third aspect, the invention provides a chemically amplified resist composition comprising at least one member selected from amine compounds having a fluorinated alkyl group and a morpholine structure, represented by the general formulae (1) to (7).

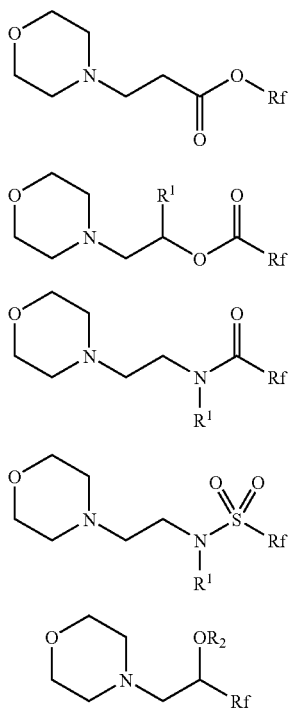

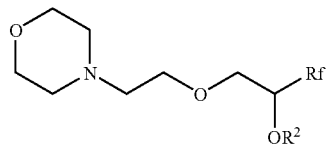

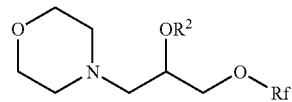

Herein Rf is a straight, branched or cyclic alkyl group of 1 to 20 carbon atoms in which some or all hydrogen atoms are substituted by fluorine atoms, $R^1$ is hydrogen or methyl, and $R^2$ is hydrogen or a straight, branched or cyclic acyl group of 1 to 10 carbon atoms in which some or all hydrogen atoms may be substituted by fluorine atoms. This resist composition exhibits a high resolution and is little dissolved in water and thus suited for the immersion lithography.

In a fourth aspect, the invention provides a chemically amplified resist composition comprising (A) at least one amine compound having a fluorinated alkyl group and a morpholine structure, represented by the general formulae (1) to (7), (B) an organic solvent, (C) a base resin having acid labile group-protected acidic functional groups which is alkali-insoluble or substantially alkali-insoluble, but becomes alkali-soluble when the acid labile groups are eliminated, and (D) a photoacid generator. This resist composition exhibits a high resolution, forms a good pattern profile, and is little dissolved in water and thus suited for the immersion lithography.

In a fifth aspect, the invention provides a patterning process comprising the steps of (1) applying any of the chemically amplified resist compositions defined above onto a substrate, (2) heat treating the applied resist, then exposing the heat-treated resist through a photomask to high-energy radiation having a wavelength of up to 300 nm or an electron beam, and (3) heat treating the exposed resist, then developing the resist with a liquid developer. The patterning process using the chemically amplified resist composition of the invention can form a resist pattern having a high resolution and rectangularity. The process advantageously complies with the immersion lithography.

In a sixth aspect, the invention provides an amine compound selected from amine compounds having a fluorinated alkyl group and a morpholine structure, represented by the general formulae (1) to (7). These amine compounds can be readily prepared in high yields by the methods to be described later, and when added in a proper amount, enable to formulate resist compositions which exhibit a high resolution, form a precisely configured pattern, and are suited for the immersion lithography. For a certain application, a proper choice of Rf, $R^1$ and $R^2$ enables to optimize resist characteristics including a pattern profile.

BENEFITS OF THE INVENTION

The chemically amplified resist compositions prepared by compounding the amine compounds having a specific structure exhibit a high resolution, form patterns of good profile, and are useful in lithographic micropatterning using electron beams and deep UV. The amine compounds exert best effects when compounded in both positive and negative resists adapted for KrF laser, ArF laser, $F_2$ laser, EUV, EB or x-ray lithography, making the resists ideal as a micropatterning material in VLSI fabrication. The compositions are compliant not only with ordinary photolithography, but also with immersion lithography.

DESCRIPTION OF THE PREFERRED EMBODIMENTS

Amine Compound

The inventors sought for a compound which when compounded in chemically amplified resist compositions, is effective for achieving a high resolution and defining a satisfactory pattern profile in not only the ordinary photolithography, but also the immersion lithography. The inventors have discovered that an amine compound having a fluorinated alkyl group, preferably an amine compound having a fluorinated alkyl and a morpholine structure, more preferably any of amine compounds having a fluorinated alkyl and a morpholine structure, represented by formulae (1) to (7), can be combined in proper amounts with a base resin and other components to formulate a chemically amplified photoresist composition which exhibits a high resolution and forms a precisely configured pattern. The resist composition of the invention is best suited for the immersion lithography because the amine compound is little dissolved in water when the composition is processed by the immersion lithography. Thus significant improvements in pattern profile and other resist properties are expectable.

The preferred amine compounds to be compounded in chemically amplified resist compositions are amine compounds having a fluorinated alkyl and a morpholine structure, represented by the general formulae (1) to (7).

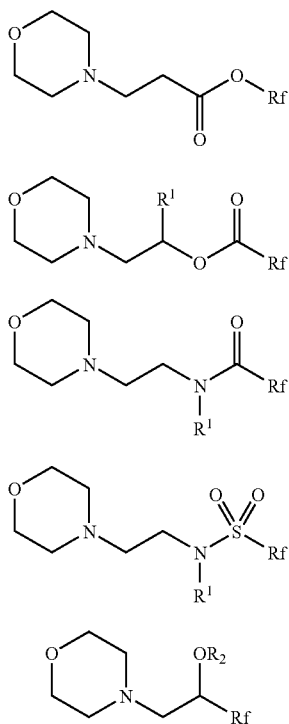

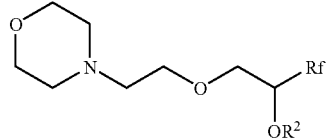

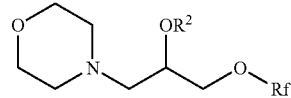

Herein Rf is a straight, branched or cyclic alkyl group of 1 to 20 carbon atoms in which some or all hydrogen atoms are substituted by fluorine atoms, $R^1$ is hydrogen or methyl, and $R^2$ is hydrogen or a straight, branched or cyclic acyl group of 1 to 10 carbon atoms in which some or all hydrogen atoms may be substituted by fluorine atoms.

In formulae (1) to (7), Rf is a straight, branched or cyclic alkyl group of 1 to 20 carbon atoms in which some or all hydrogen atoms are substituted by fluorine atoms. Examples of suitable alkyl groups include, but are not limited to, fluoromethyl, difluoromethyl, trifluoromethyl, 2,2,2-trifluoroethyl, pentafluoroethyl, 2,2,2-trifluoro-1-trifluoromethylethyl, perfluoroisopropyl, heptafluoropropyl, 2,2,3,3-tetrafluoropropyl, 2,2,3,3,3-pentafluoropropyl, 3,3,3-trifluoro-2-trifluoromethyl-propyl, nonafluorobutyl, 1H,1H,5H-octafluoropentyl, 1H,1H-nonafluoropentyl, perfluoropentyl, 1H,1H-4-trifluoromethylperfluoropentyl, perfluorohexyl, 4-pentafluoroethylperfluorocyclohexyl, 1H,1H,2H,2H-perfluorohexyl, perfluorocyclohexyl, 1H,1H-perfluoroheptyl, 1H,1H,7H-perfluoroheptyl, perfluorooctyl, 1H,1H,2H,2H-perfluorooctyl, 1H,1H-perfluorononyl, perfluorodecyl, 1H,1H,10H-perfluorodecyl, 1H,1H,2H,2H-perfluorodecyl, 1H,1H-perfluoroundecyl, perfluorododecyl, 1H,1H,2H,2H-perfluorododecyl, and perfluoroeicosanyl.

In formulae (2) to (4), $R^1$ is hydrogen or methyl.

In formulae (5) to (7), $R^2$ is hydrogen or a straight, branched or cyclic acyl group of 1 to 10 carbon atoms in which some or all hydrogen atoms may be substituted by fluorine atoms. Examples of $R^2$ include, but are not limited to, a hydrogen atom, formyl, acetyl, propionyl, butyryl, isobutyryl, valeryl, hexanoyl, cyclopentanecarbonyl, cyclohexanecarbonyl, octanoyl, decanoyl, trifluoroacetyl, pentafluoropropionyl, heptafluorobutyryl, 4,4,4-trifluoro-3-trifluoromethyl-butyryl, and 4,4,5,5,6,6,6-heptafluorohexanoyl.

Illustrative, non-limiting, examples of the amine compound of formula (1) are given below.

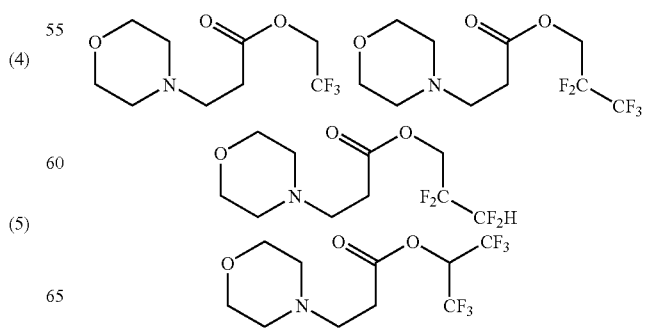

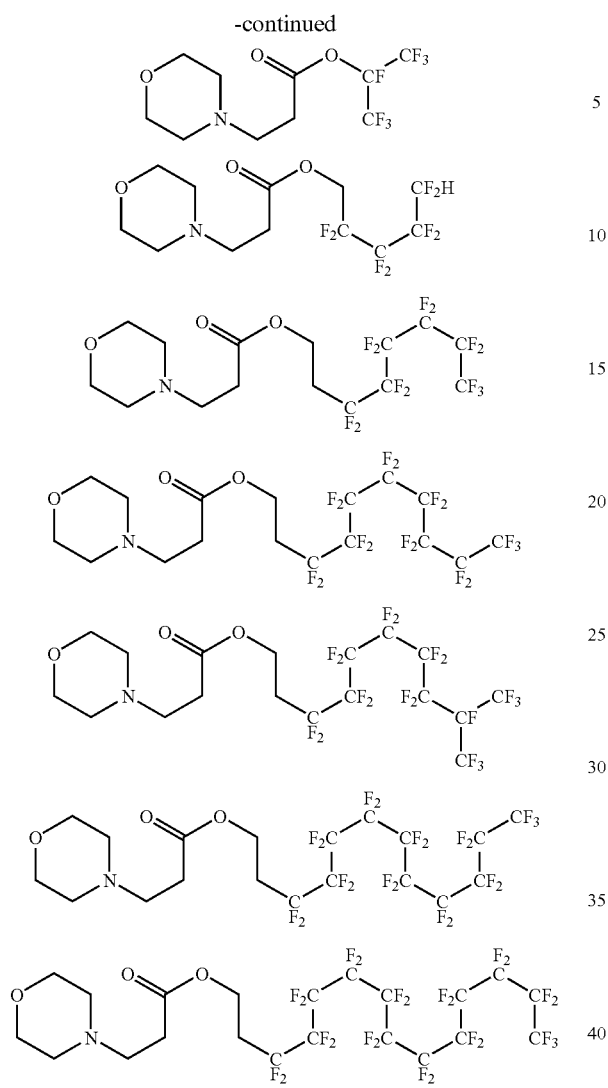
Illustrative, non-limiting, examples of the amine compound of formula (2) are given below.
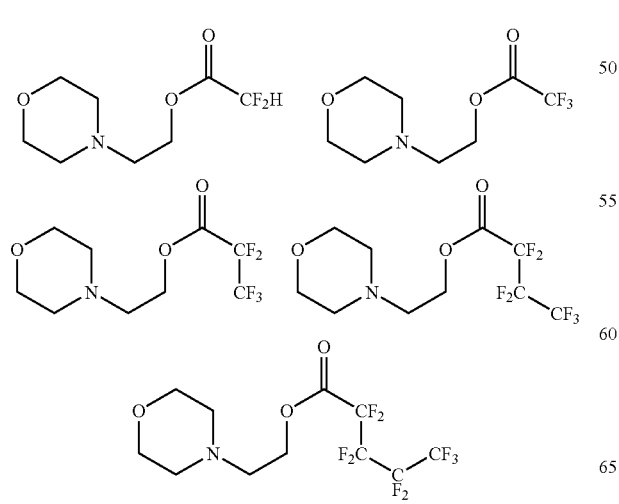
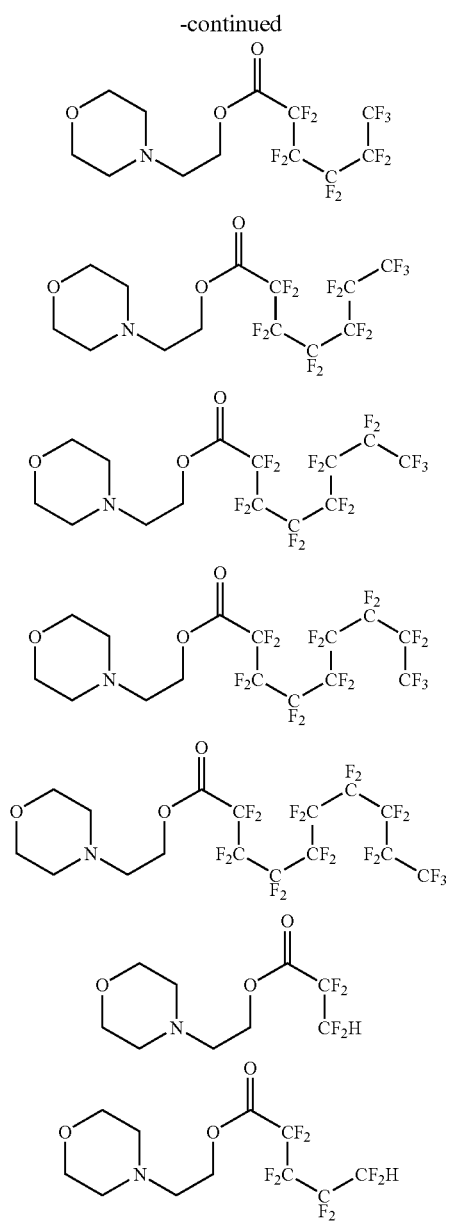
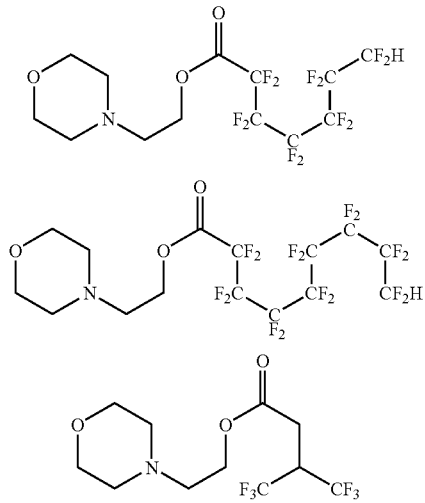

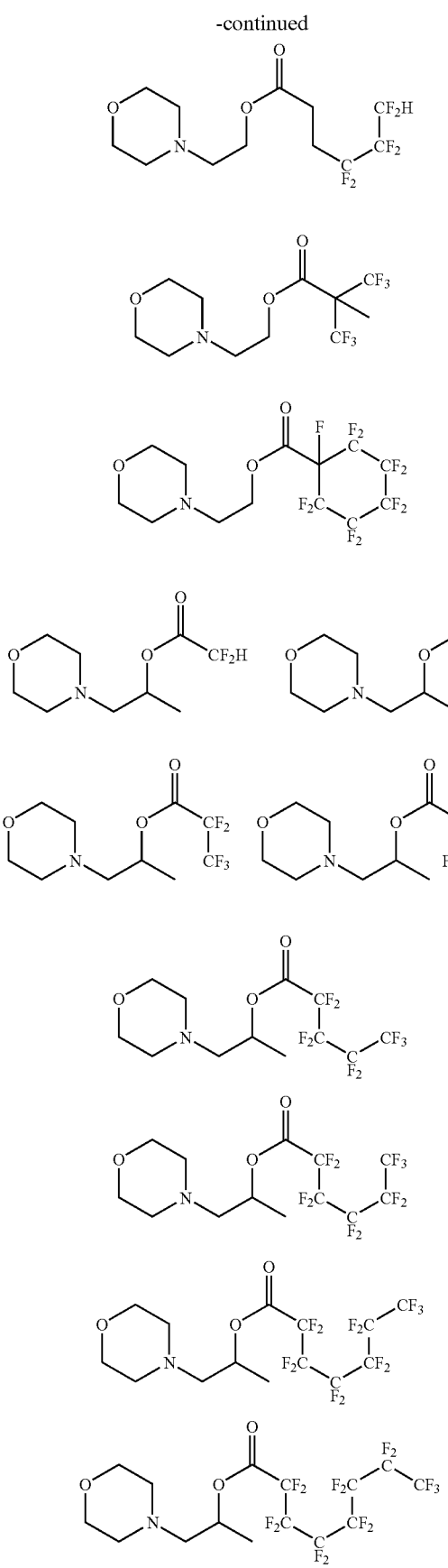
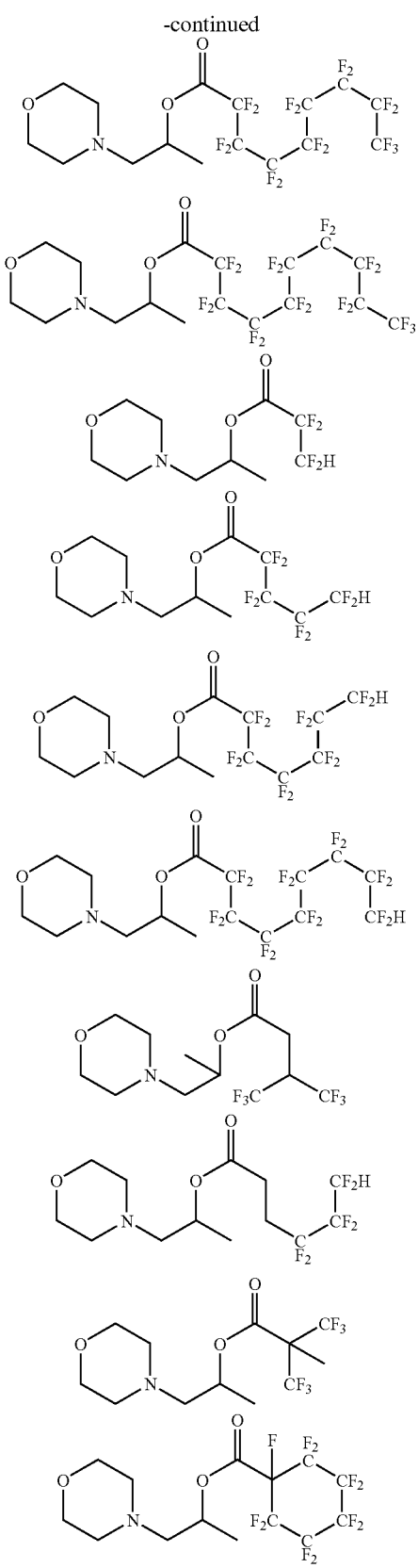
Illustrative, non-limiting, examples of the amine compound of formula (3) are given below.

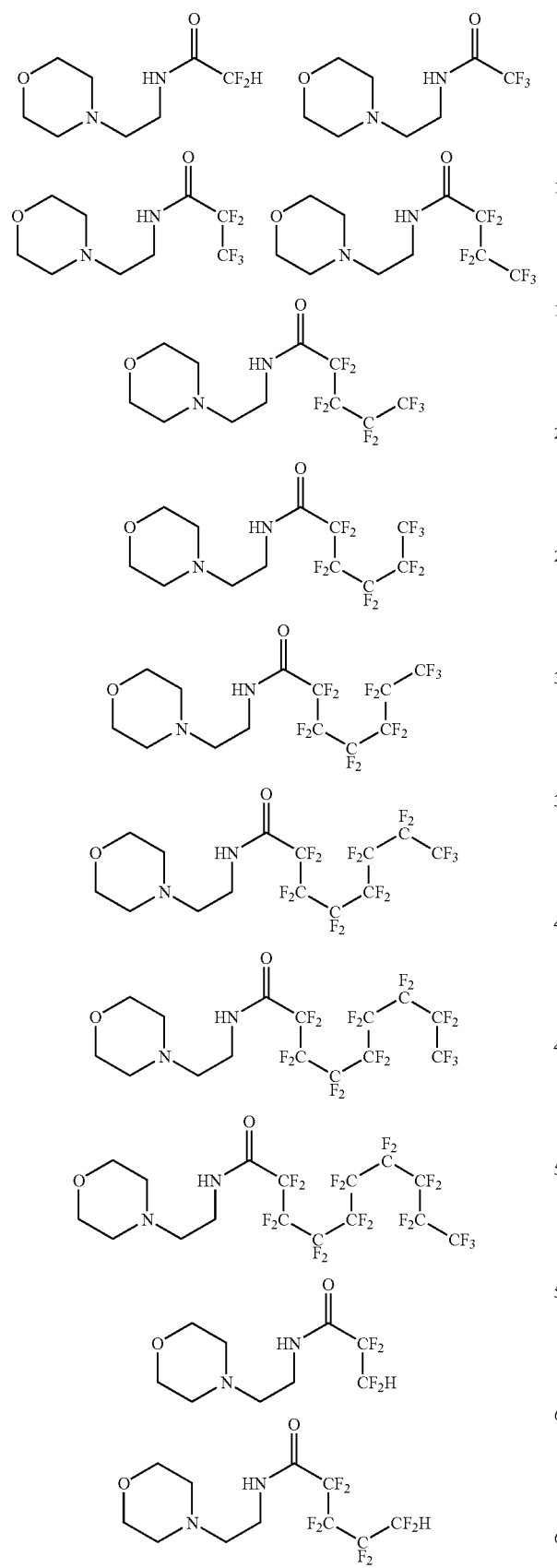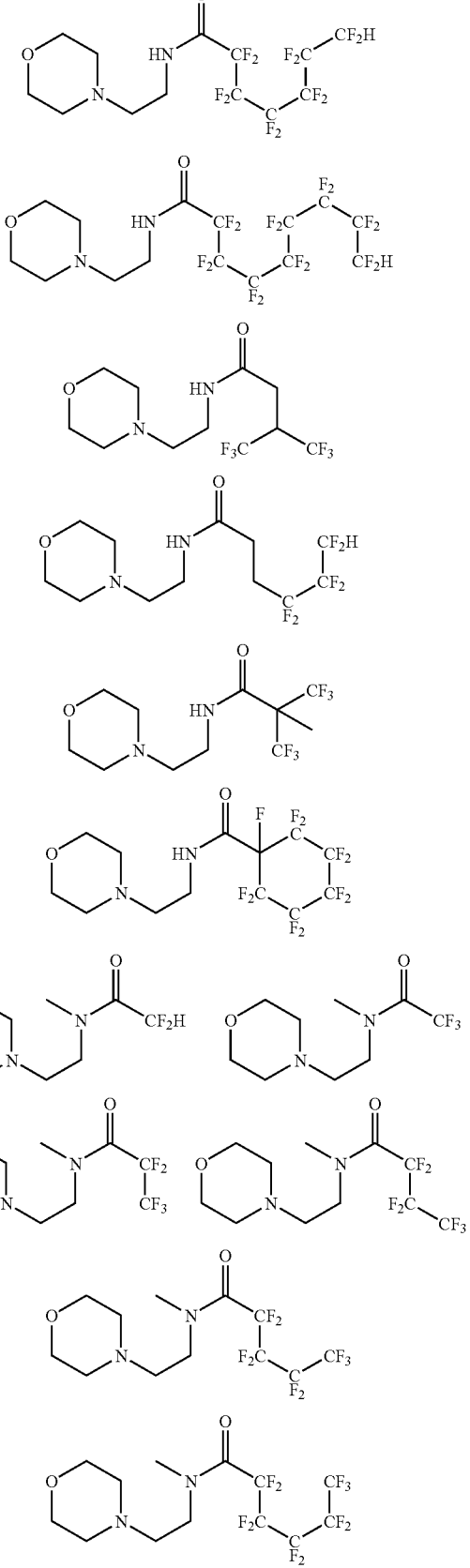

-continued
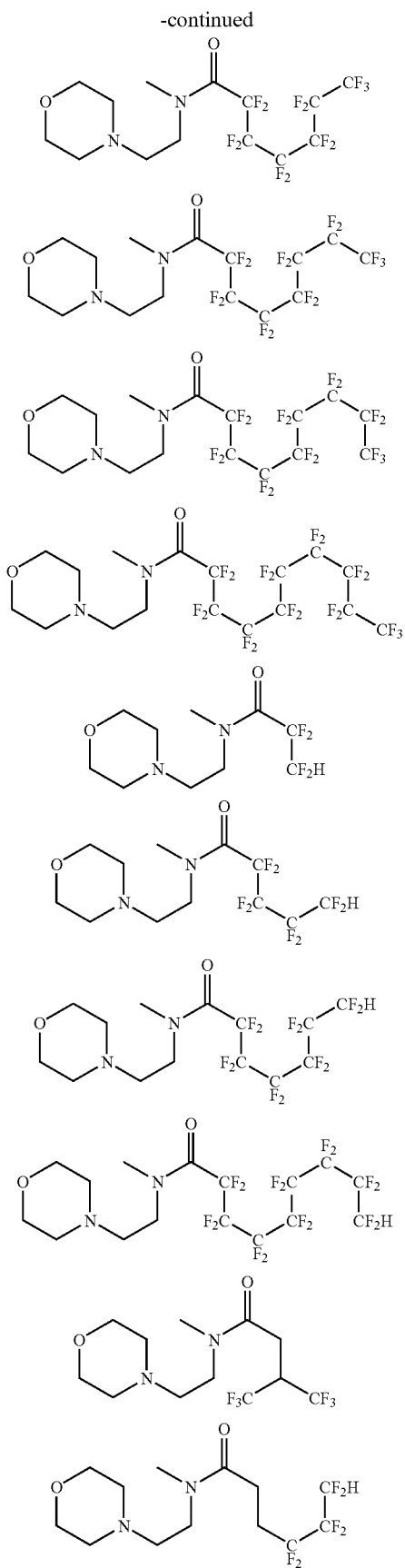
-continued
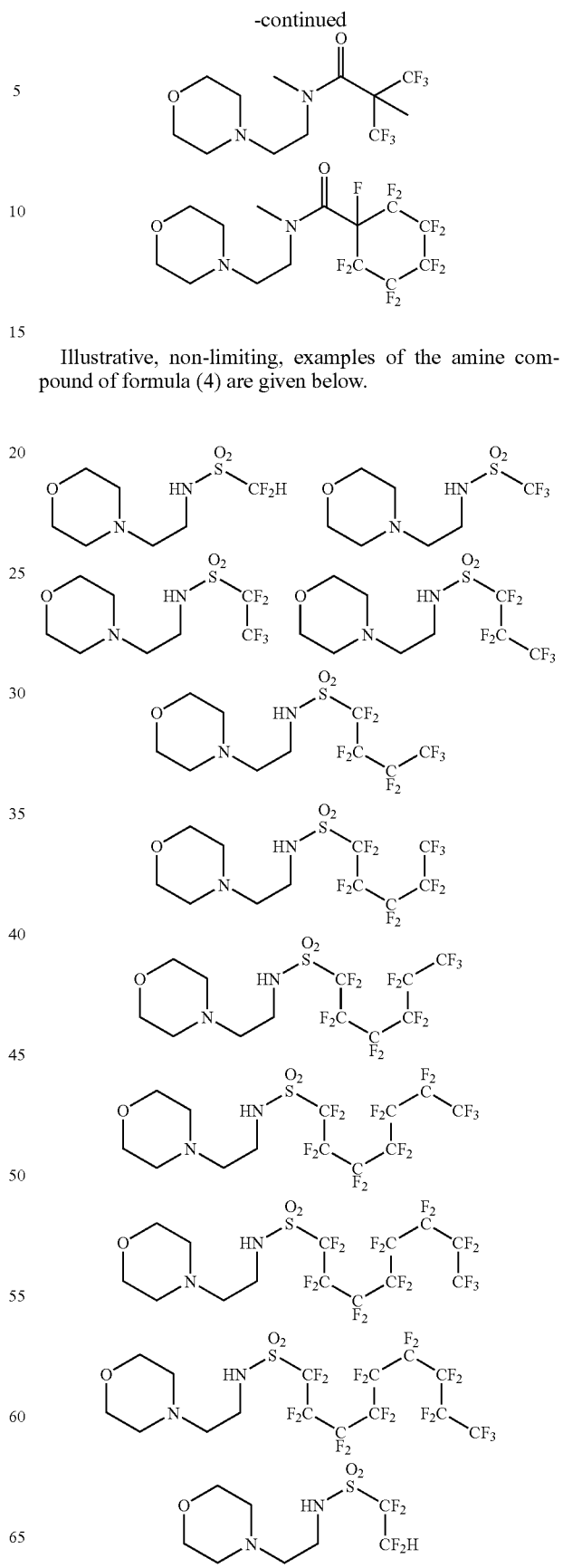
Illustrative, non-limiting, examples of the amine compound of formula (4) are given below.

-continued
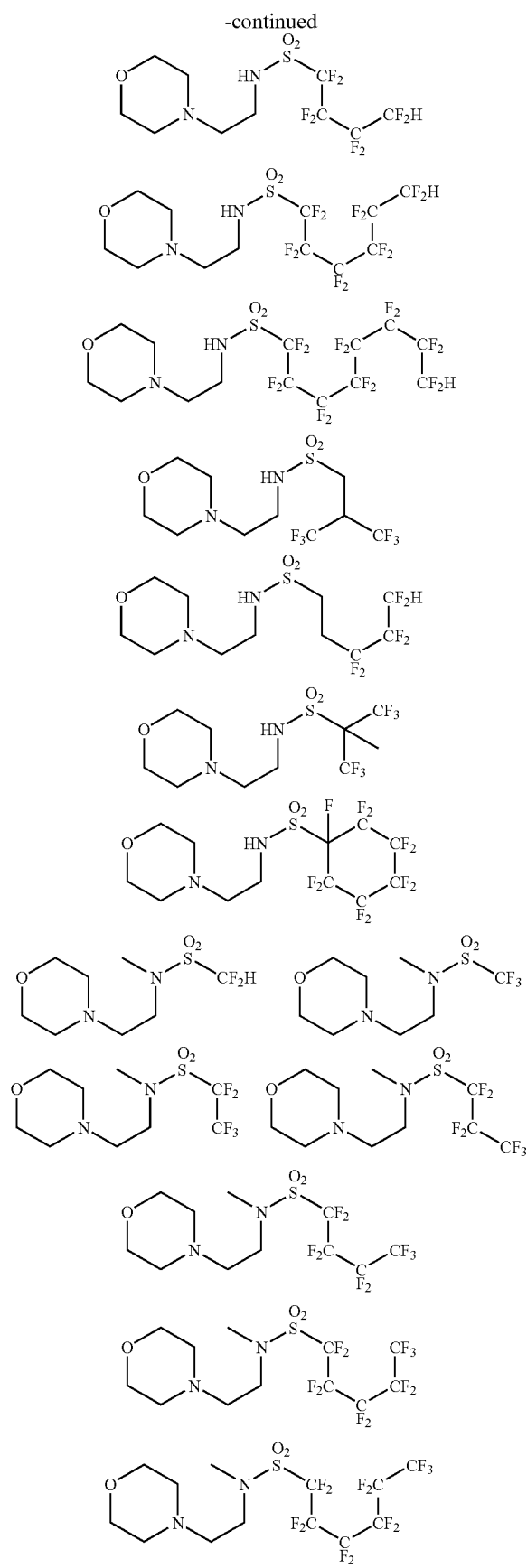
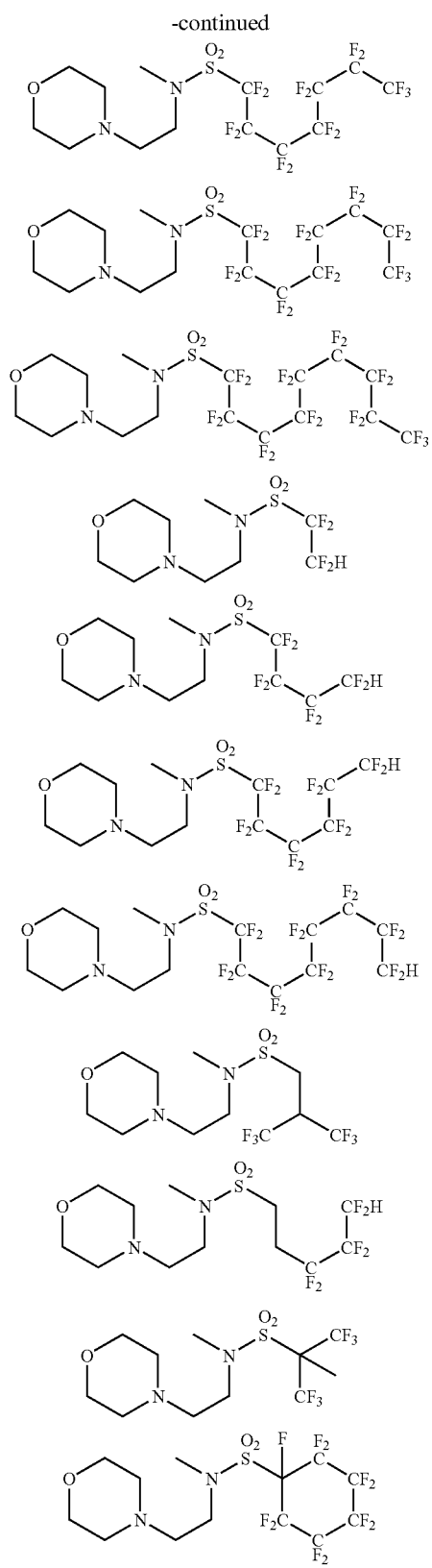
Illustrative, non-limiting, examples of the amine compound of formula (5) are given below. The abbreviation "Ac" as used throughout the specification denotes acetyl.

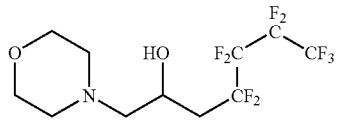
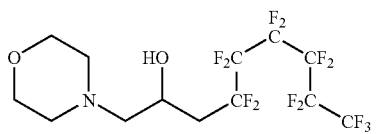
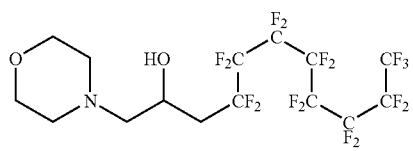
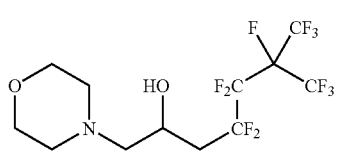
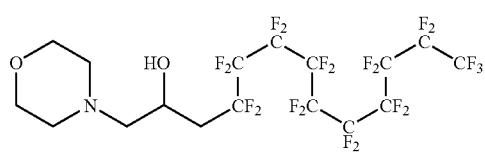
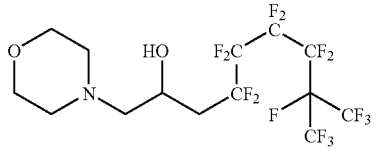
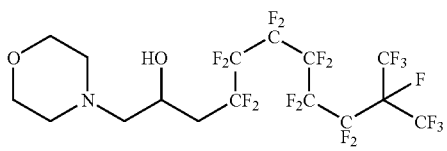
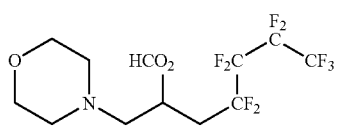
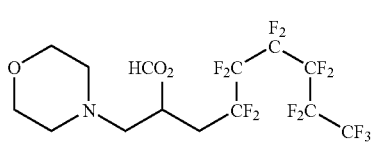
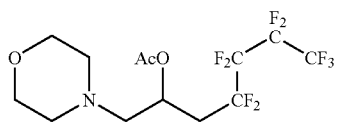
-continued
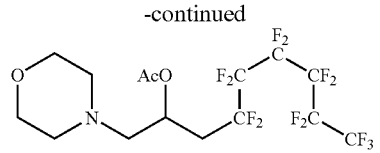
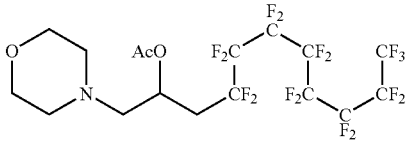
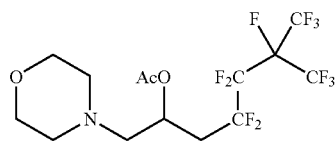
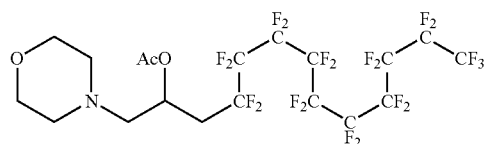
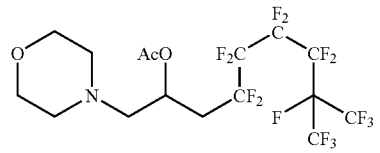
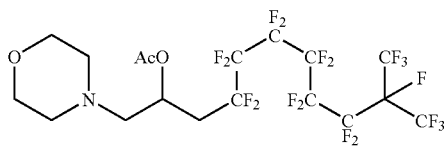
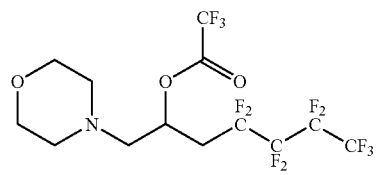
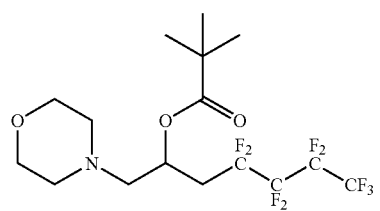
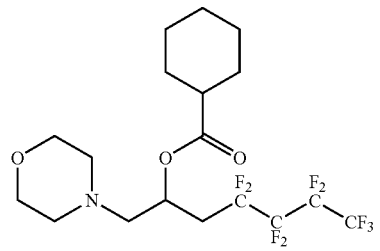

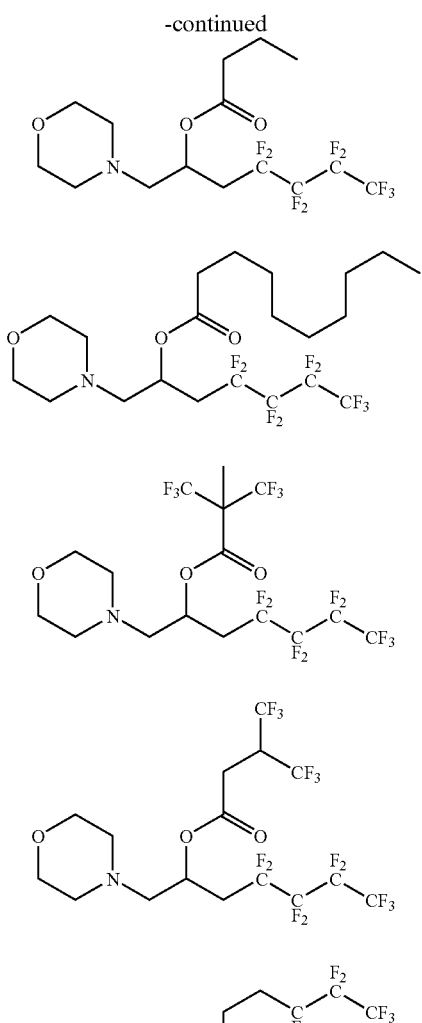
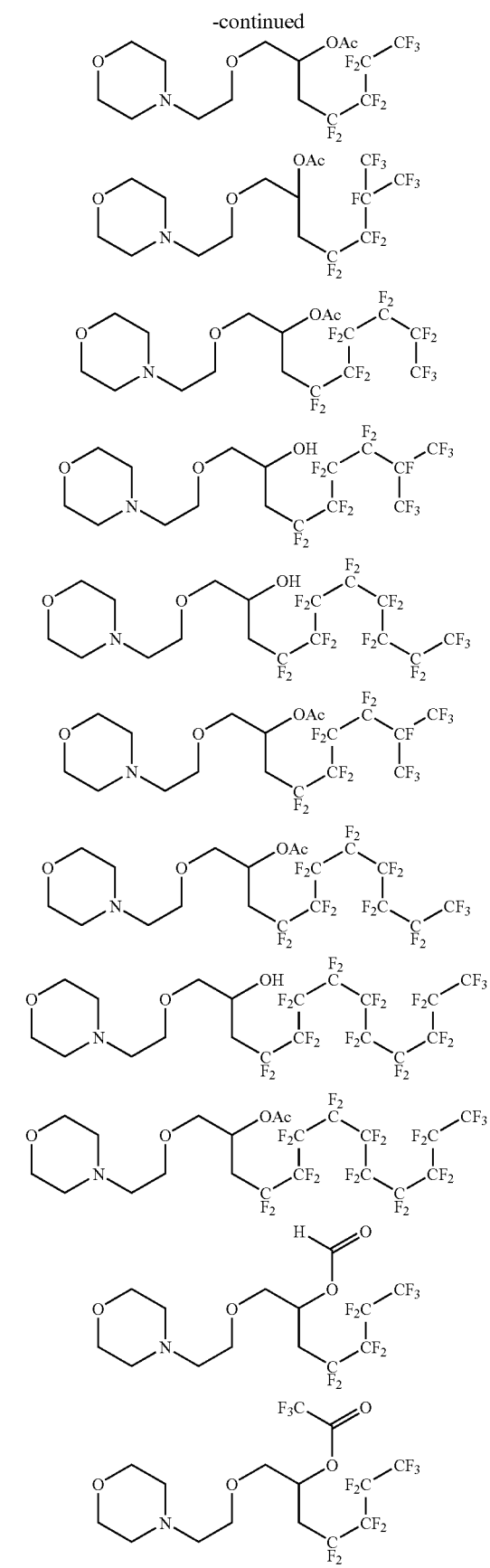
Illustrative, non-limiting, examples of the amine compound of formula (6) are given below.
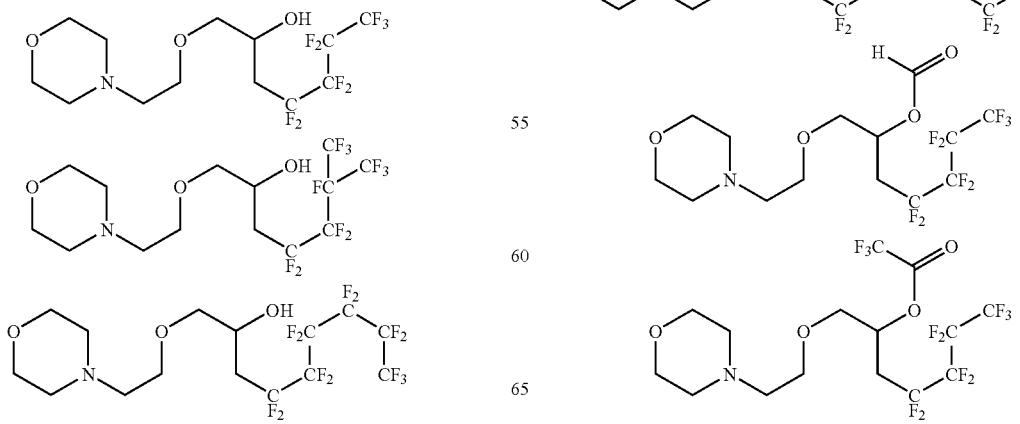

-continued
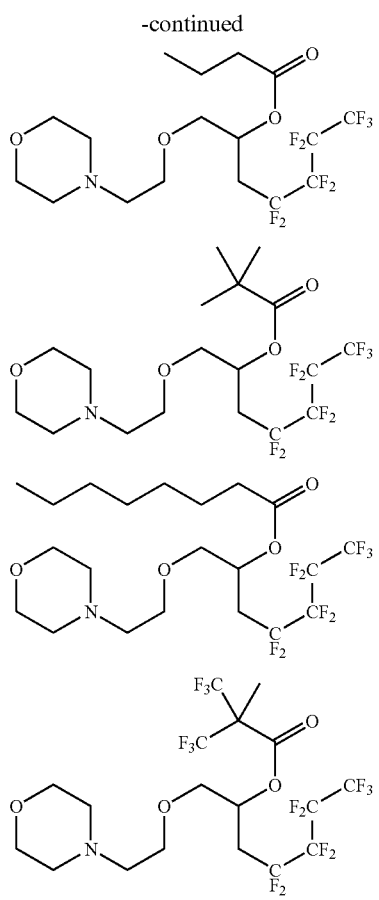
Illustrative, non-limiting, examples of the amine compound of formula (7) are given below.
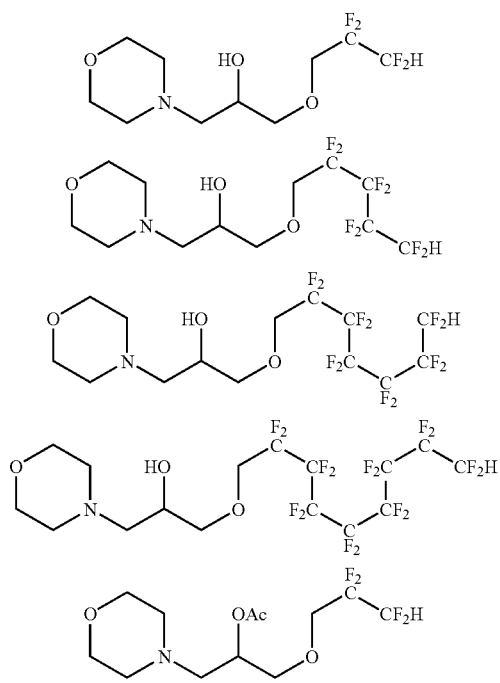
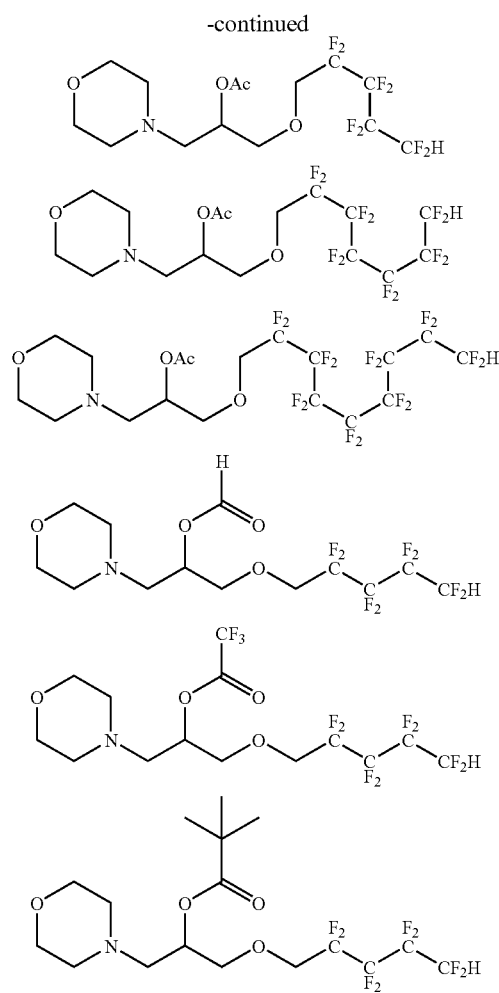
In the amine compounds having a fluorinated alkyl group and a morpholine structure in the molecule, the morpholine structure and the functional group located nearby such as ester, amide, ether, or alcohol have a high affinity to acids. It is anticipated that the morpholine structure and the functional group enable to rapidly capture the acid generated from the photoacid generator, while the fluorinated alkyl group affects the water-solubility suppressing effect of the amine compound and the distribution of the amine compound in the resist film. As a result, the photoresist composition having added thereto the amine compound is endowed with an ability to achieve a high resolution and an excellent pattern profile. By selecting for a certain application an optimal structure compound from among many possible amine compounds having a fluorinated alkyl group and a morpholine structure according to the invention, the volatility, basicity, acid-capturing rate, diffusion rate within the resist, and water solubility of the amine compound can be suitably adjusted so as to comply with a particular combination of resist polymer, photoacid generator, and lithography. This eventually enables to optimize resist material characteristics such as pattern profile.

The amine compounds of formulae (1) to (7) are novel. They are prepared by a proper method that is selected in accordance with the structure of a particular compound. Preparation methods for respective compounds are described below in detail although the preparation method is not limited thereto.

An amine compound of formula (1) may be prepared, for example, through Michael addition reaction of morpholine (8) to an acrylate compound (9) as shown by the reaction scheme below. This reaction can be performed by a standard technique known for the Michael addition reaction of secondary amine compounds to acrylate compounds.

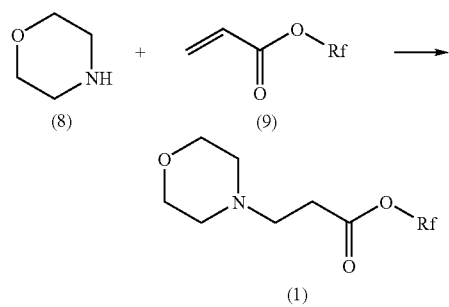

Herein Rf is a straight, branched or cyclic alkyl group of 1 to 20 carbon atoms in which some or all hydrogen atoms are substituted by fluorine atoms.

An amine compound of formula (2) may be prepared, for example, through esterification reaction of an alcohol (10) with an acylating agent (11) as shown by the reaction scheme below. This reaction can be performed by a standard technique known for the esterification reaction of alcohol compounds with acylating agents.

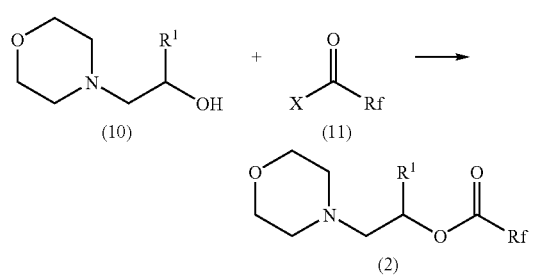

Herein Rf is a straight, branched or cyclic alkyl group of 1 to 20 carbon atoms in which some or all hydrogen atoms are substituted by fluorine atoms; $R^1$ is hydrogen or methyl; and X is a leaving group such as a halogen atom, acyl group or hydroxyl group.

An amine compound of formula (3) may be prepared, for example, through amidation reaction of an amine compound (12) with an acylating agent (11) as shown by the reaction scheme below. This reaction can be performed by a standard technique known for the amidation reaction of amine compounds with acylating agents.

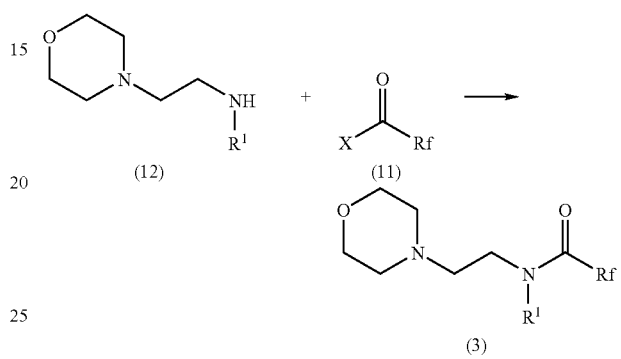

Herein Rf is a straight, branched or cyclic alkyl group of 1 to 20 carbon atoms in which some or all hydrogen atoms are substituted by fluorine atoms; $R^1$ is hydrogen or methyl; and X is a leaving group such as a halogen atom, acyl group or hydroxyl group.

An amine compound of formula (4) may be prepared, for example, through amidation reaction of an amine compound (12) with an alkylsulfonylating agent (13) as shown by the reaction scheme below. This reaction can be performed by a standard technique known for the amidation reaction of amine compounds with alkylsulfonylating agents.

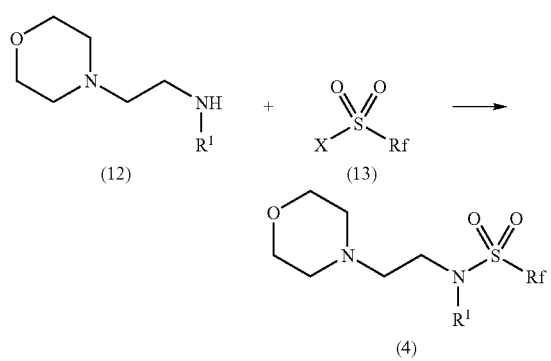

Herein Rf is a straight, branched or cyclic alkyl group of 1 to 20 carbon atoms in which some or all hydrogen atoms are substituted by fluorine atoms; $R^1$ is hydrogen or methyl; and X is a leaving group such as a halogen atom, acyl group or hydroxyl group.

An amine compound of formula (5) wherein $R^2$=H may be prepared, for example, through addition reaction of morpholine (8) to an epoxy compound (14) as shown by the reaction scheme below. This reaction can be performed by a standard technique known for the addition reaction of secondary amine compounds to epoxy compounds. An amine compound of formula (5) wherein $R^2$=acyl may be prepared, for example, through esterification reaction of an alcohol compound (5) wherein $R^2$=H with an acylating agent $R^2X$ as shown by the reaction scheme below. This reaction can be performed by a standard technique known for the esterification reaction of alcohol compounds with acylating agents.

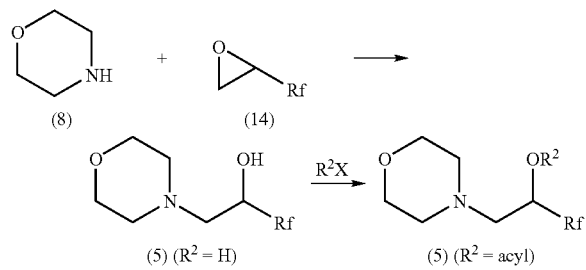

Herein Rf is a straight, branched or cyclic alkyl group of 1 to 20 carbon atoms in which some or all hydrogen atoms are substituted by fluorine atoms; $R^2$ is hydrogen or a straight, branched or cyclic acyl group of 1 to 10 carbon atoms in which some or all hydrogen atoms may be substituted by fluorine atoms; and X is a leaving group such as a halogen atom, acyl group or hydroxyl group.

An amine compound of formula (6) wherein $R^2$=H may be prepared, for example, through addition reaction of 2-morpholinoethanol (15) to an epoxy compound (14) as shown by the reaction scheme below. This reaction can be performed by a standard technique known for the addition reaction of primary alcohol compounds to epoxy compounds. An amine compound of formula (6) wherein $R^2$=acyl may be prepared, for example, through esterification reaction of an alcohol compound (6) wherein $R^2$=H with an acylating agent $R^2X$ as shown by the reaction scheme below. This reaction can be performed by a standard technique known for the esterification reaction of alcohol compounds with acylating agents.

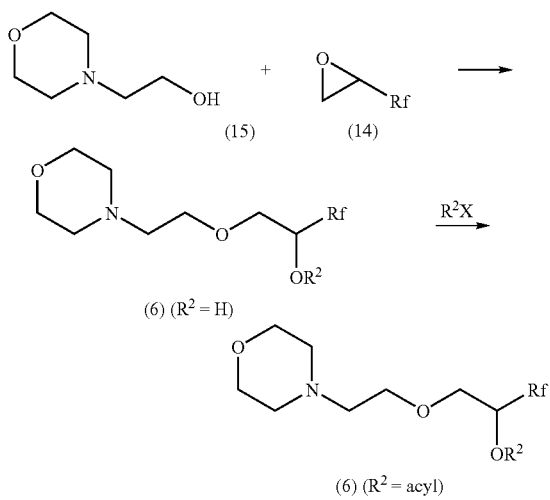

Herein Rf is a straight, branched or cyclic alkyl group of 1 to 20 carbon atoms in which some or all hydrogen atoms are substituted by fluorine atoms; $R^2$ is hydrogen or a straight, branched or cyclic acyl group of 1 to 10 carbon atoms in which some or all hydrogen atoms may be substituted by fluorine atoms; and X is a leaving group such as a halogen atom, acyl group or hydroxyl group.

An amine compound of formula (7) wherein $R^2$=H may be prepared, for example, through addition reaction of morpholine (8) to an epoxy compound (15) as shown by the reaction scheme below. This reaction can be performed by a standard technique known for the addition reaction of secondary amine compounds to epoxy compounds. An amine compound of formula (7) wherein $R^2$=acyl may be prepared, for example, through esterification reaction of an alcohol compound (7) wherein $R^2$=H with an acylating agent $R^2X$ as shown by the reaction scheme below. This reaction can be performed by a standard technique known for the esterification reaction of alcohol compounds with acylating agents.

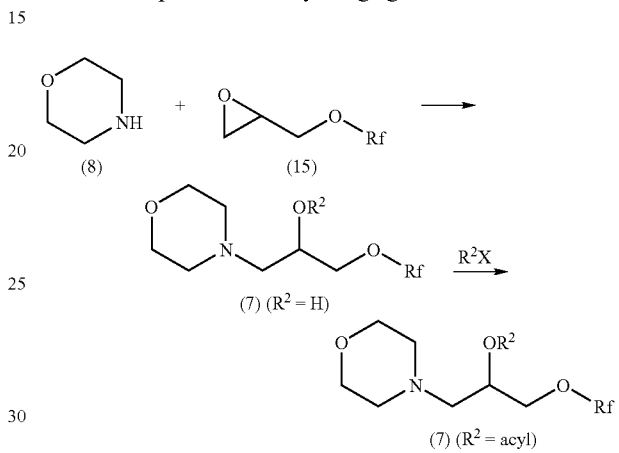

Herein Rf is a straight, branched or cyclic alkyl group of 1 to 20 carbon atoms in which some or all hydrogen atoms are substituted by fluorine atoms; $R^2$ is hydrogen or a straight, branched or cyclic acyl group of 1 to 10 carbon atoms in which some or all hydrogen atoms may be substituted by fluorine atoms; and X is a leaving group such as a halogen atom, acyl group or hydroxyl group.

Resist Composition

As previously described, the amine compound of the invention is effective as a basic compound component to be formulated in a chemically amplified resist composition. The chemically amplified resist composition of the invention is typically defined as comprising (A) one or more amine compounds having a fluorinated alkyl group and a morpholine structure, represented by formulae (1) to (7), (B) an organic solvent, (C) a base resin having an acid labile group-protected acidic functional group which is alkali-insoluble or substantially alkali-insoluble, but becomes alkali-soluble when the acid labile group is eliminated, and (D) a photoacid generator.

In the inventive resist composition, an appropriate amount of the amine compound (A) compounded is 0.01 to 2 parts by weight, desirably 0.01 to 1 part by weight per 100 parts by weight of the base resin (C). Outside the range, less amounts of the amine compound may fail to achieve the desired effect whereas larger amounts may lower the sensitivity of the resist.

Organic Solvent B

The organic solvent used herein may be any organic solvent in which the amine compound, base resin, photoacid generator, and other components are soluble. Illustrative, non-limiting, examples of the organic solvent include ketones such as cyclohexanone and methyl n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, propylene glycol monomethyl ether acetate, and mixtures thereof because the photoacid generator is most soluble therein.

An appropriate amount of the organic solvent used is about 200 to 1,000 parts, especially about 400 to 800 parts by weight per 100 parts by weight of the base resin.

Base Polymer C

The base polymers used as component (C) in the inventive compositions include polyhydroxystyrene (PHS), and copolymers of hydroxystyrene with styrene, (meth)acrylic acid esters or other polymerizable olefinic compounds, for KrF excimer laser resist use; (meth)acrylic acid ester polymers, alternating copolymers of cycloolefin with maleic anhydride, similar alternating copolymers further containing vinyl ethers or (meth)acrylic acid esters, polynorbornene, and ring-opening metathesis polymerized cycloolefins, for ArF excimer laser resist use; and fluorinated forms of the foregoing polymers (for both KrF and ArF laser uses) and polymers resulting from ring-closure polymerization using fluorinated dienes for $F_2$ excimer laser resist use. Silicon-substituted forms of the foregoing polymers and polysilsesquioxane polymers are useful for the bilayer resists. The base resin is not limited to the polymers of these systems. The base polymers may be used alone or in admixture of two or more. In the case of positive resist compositions, it is a common practice to substitute acid labile groups for hydroxyl groups on phenol, carboxyl groups or fluorinated alkyl alcohols for reducing the rate of dissolution in unexposed regions.

The acid labile groups to be introduced into the base polymers may be selected from a variety of such groups, preferably from acetal groups of 2 to 30 carbon atoms and tertiary alkyl groups of 4 to 30 carbon atoms having the formulae (C1) and (C2), respectively.

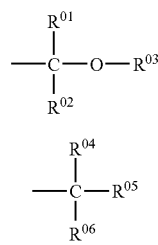

In formulae (C1) and (C2), $R^{01}$ and $R^{02}$ each are hydrogen or a straight, branched or cyclic alkyl group of 1 to 20 carbon atoms, preferably 1 to 12 carbon atoms, which may contain a heteroatom such as oxygen, sulfur, nitrogen or fluorine, $R^{03}$, $R^{04}$, $R^{05}$ and $R^{06}$ each are a straight, branched or cyclic alkyl group, aryl group or aralkyl group of 1 to 20 carbon atoms, preferably 1 to 12 carbon atoms, which may contain a heteroatom such as oxygen, sulfur, nitrogen or fluorine. A pair of $R^{01}$ and $R^{02}$, a pair of $R^{01}$ and $R^{03}$, a pair of $R^{02}$ and $R^{03}$, a pair of $R^{04}$ and $R^{05}$, a pair of $R^{04}$ and $R^{06}$, or a pair of $R^{05}$ and $R^{06}$, taken together, may form a ring of 3 to 20 carbon atoms, preferably 3 to 12 carbon atoms, with the carbon or oxygen atom to which they are attached.

Illustrative examples of the acetal group of formula (C1) include, but are not limited to, methoxymethyl, ethoxymethyl, propoxymethyl, butoxymethyl, isopropoxymethyl, t-butoxymethyl, 1-methoxyethyl, 1-methoxypropyl, 1-methoxybutyl, 1-ethoxyethyl, 1-ethoxypropyl, 1-ethoxybutyl, 1-propoxyethyl, 1-propoxypropyl, 1-propoxybutyl, 1-cyclopentyloxyethyl, 1-cyclohexyloxyethyl, 2-methoxyisopropyl, 2-ethoxyisopropyl, 1-phenoxyethyl, 1-benzyloxyethyl, 1-phenoxypropyl, 1-benzyloxypropyl, 1-adamantyloxyethyl, 1-adamantyloxypropyl, 2-tetrahydrofuryl, 2-tetrahydro-2H-pyranyl, 1-(2-cyclohexanecarbonyloxyethoxy)ethyl, 1-(2-cyclohexanecarbonyloxyethoxy)propyl, 1-[2-(1-adamantylcarbonyloxy)ethoxy]ethyl, and 1-[2-(1-adamantylcarbonyloxy)ethoxy]propyl.

Illustrative examples of the tertiary alkyl group of formula (C2) include, but are not limited to, t-butyl, t-pentyl, 1-ethyl-1-methylpropyl, 1,1-diethylpropyl, 1,1,2-trimethylpropyl, 1-adamantyl-1-methylethyl, 1-methyl-1-(2-norbornyl)ethyl, 1-methyl-1-(tetrahydrofuran-2-yl)ethyl, 1-methyl-1-(7-oxanorbornan-2-yl)ethyl, 1-methylcyclopentyl, 1-ethylcyclopentyl, 1-propylcyclopentyl, 1-cyclopentylcyclopentyl, 1-cyclohexylcyclopentyl, 1-(2-tetrahydrofuryl)cyclopentyl, 1-(7-oxanorbornan-2-yl)cyclopentyl, 1-methylcyclohexyl, 1-ethylcyclohexyl, 1-cyclopentylcyclohexyl, 1-cyclohexylcyclohexyl, 2-methyl-2-norbornyl, 2-ethyl-2-norbornyl, 8-methyl-8-tricyclo[5.2.1.0$^{2,6}$]decyl, 8-ethyl-8-tricyclo[5.2.1.0$^{2,6}$]decyl, 3-methyl-3-tetracyclo[4.4.0.1$^{2,5}$.1$^{7,10}$]dodecyl, 3-ethyl-3-tetracyclo[4.4.0.1$^{2,5}$.1$^{7,10}$]dodecyl, 2-methyl-2-adamantyl, 2-ethyl-2-adamantyl, 1-methyl-3-oxo-1-cyclohexyl, 1-methyl-1-(tetrahydrofuran-2-yl)ethyl, 5-hydroxy-2-methyl-2-adamantyl, and 5-hydroxy-2-ethyl-2-adamantyl.

In the base resin, some hydroxyl groups may be linked via acid labile groups of the following general formula (C3a) or (C3b) for crosslinkage between molecules or within a molecule.

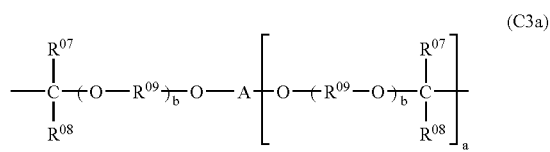

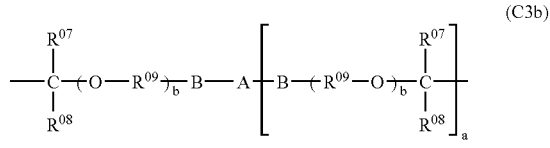

Herein, $R^{07}$ and $R^{08}$ each are hydrogen or a straight, branched or cyclic alkyl group of 1 to 8 carbon atoms, or $R^{07}$ and $R^{08}$, taken together, may form a ring, with the proviso that each of $R^{07}$ and $R^{08}$ is a straight or branched alkylene group of 1 to 8 carbon atoms when they form a ring. $R^{09}$ is a straight, branched or cyclic alkylene group of 1 to 10 carbon atoms. Letter "a" is an integer of 1 to 7, and "b" is 0 or an integer of 1 to 10. "A" is a (a+1)-valent aliphatic or alicyclic saturated hydrocarbon group, aromatic hydrocarbon group or heterocyclic group of 1 to 50 carbon atoms, which may have an intervening heteroatom and in which the hydrogen atom attached to a carbon atom may be partially replaced by a hydroxyl group, carboxyl group, carbonyl group or fluorine atom. B is —CO—O—, —NHCO—O— or —NHCONH—.

Illustrative examples of the crosslinking acetal linkages represented by formulae (C3a) and (C3b) are given below as (C3)-1 through (C3)-8, but not limited thereto.

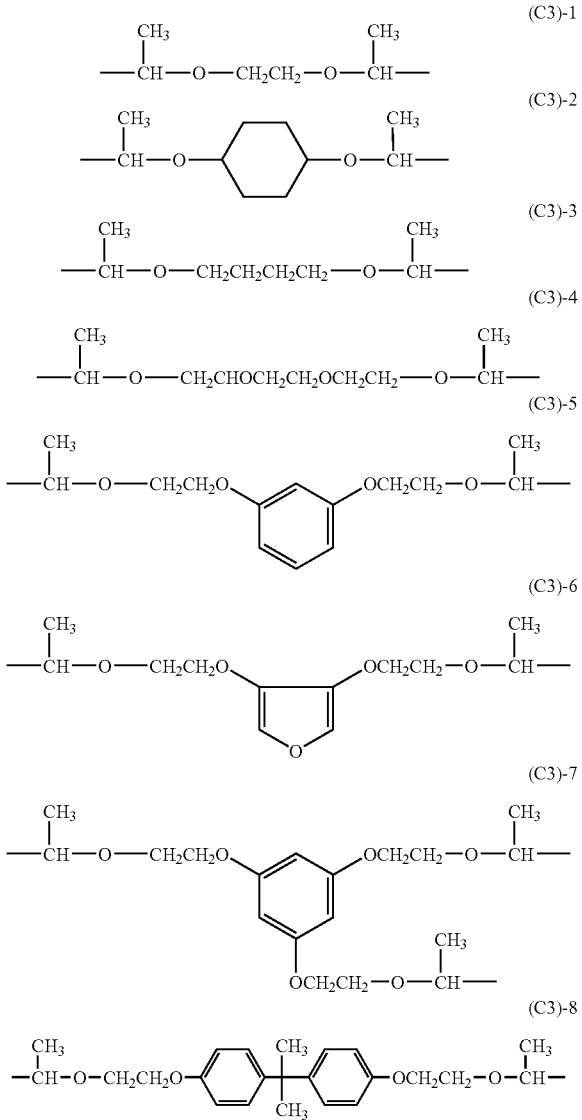

Preferably the base polymer has a weight average molecular weight (Mw) of 2,000 to 100,000 as measured by gel permeation chromatography (GPC) using polystyrene standards. With Mw below 2,000, film formation and resolution may become poor. With Mw beyond 100,000, resolution may become poor or foreign matter may generate during pattern formation.

Photoacid Generator D

The resist composition further contains (D) a compound capable of generating an acid upon exposure to high-energy radiation, that is, a photoacid generator. Suitable photoacid generators include sulfonium salts, iodonium salts, sulfonyldiazomethane, N-sulfonyloxyimide, and oxime-O-sulfonate photoacid generators. Exemplary photoacid generators are given below while they may be used alone or in admixture of two or more.

Sulfonium salts are salts of sulfonium cations with sulfonates, bis(substituted alkylsulfonyl)imides and tris(substituted alkylsulfonyl)methides. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl) diphenylsulfonium, bis(3,4-di-tert-butoxyphenyl) phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxo-2-phenylethylthiacyclopentanium, 4-n-butoxynaphthyl-1-thiacyclopentanium, and 2-n-butoxynaphthyl-1-thiacyclopentanium. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4'-toluenesulfonyloxy)benzenesulfonate, naphthalenesulfonate, camphorsulfonate, octanesulfonate, dodecylbenzenesulfonate, butanesulfonate, methanesulfonate, 1,1-difluoro-2-naphthyl-ethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl) ethanesulfonate. Exemplary bis(substituted alkylsulfonyl) imides include bistrifluoromethylsulfonylimide, bispentafluoroethylsulfonylimide, bisheptafluoropropylsulfonylimide, and 1,3-propylenebissulfonylimide. A typical tris(substituted alkylsulfonyl)methide is tristrifluoromethylsulfonylmethide. Sulfonium salts based on combination of the foregoing examples are included.

Iodonium salts are salts of iodonium cations with sulfonates, bis(substituted alkylsulfonyl)imides and tris(substituted alkylsulfonyl)methides. Exemplary iodonium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, methanesulfonate, 1,1-difluoro- 2-naphthyl-ethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl) ethanesulfonate. Exemplary bis(substituted alkylsulfonyl) imides include bistrifluoromethylsulfonylimide, bispentafluoroethylsulfonylimide, bisheptafluoropropylsulfonylimide, and 1,3-propylenebissulfonylimide. A typical tris(substituted alkylsulfonyl)methide is tristrifluoromethylsulfonylmethide. Iodonium salts based on combination of the foregoing examples are included.

Exemplary sulfonyldiazomethane compounds include bissulfonyldiazomethane compounds and sulfonyl-carbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, bis(4-acetyloxyphenylsulfonyl)diazomethane, bis(4-methanesulfonyloxyphenylsulfonyl)diazomethane, bis(4-(4-toluenesulfonyloxy)phenylsulfonyl)diazomethane, bis(4-(n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, naphthalenesulfonate, camphorsulfonate, octanesulfonate, dodecylbenzenesulfonate, butanesulfonate, methanesulfonate, 1,1-difluoro-2-naphthyl-ethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl) ethanesulfonate.

Benzoinsulfonate photoacid generators include benzoin tosylate, benzoin mesylate, and benzoin butanesulfonate.

Pyrogallol trisulfonate photoacid generators include pyrogallol, phloroglucinol, catechol, resorcinol, and hydroquinone, in which all the hydroxyl groups are substituted with trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate, 1,1-difluoro-2-naphthyl-ethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl) ethanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate, 1,1-difluoro-2-naphthyl-ethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate. Also useful are analogous nitrobenzyl sulfonate compounds in which the nitro group on the benzyl side is substituted with a trifluoromethyl group.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Photoacid generators in the form of glyoxime derivatives are described in Japanese Patent No. 2,906,999 and JP-A 9-301948 and include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(methanesulfonyl)-α-dimethylglyoxime, bis-O-(trifluoromethanesulfonyl)-α-dimethylglyoxime, bis-O-(2,2,2-trifluoroethanesulfonyl)-α-dimethylglyoxime, bis-O-(10-camphorsulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-trifluoromethylbenzenesulfonyl)-α-dimethylglyoxime, bis-O-(xylenesulfonyl)-α-dimethylglyoxime, bis-O-(trifluoromethanesulfonyl)-nioxime, bis-O-(2,2,2-trifluoroethanesulfonyl)-nioxime, bis-O-(10-camphorsulfonyl)-nioxime, bis-O-(benzenesulfonyl)-nioxime, bis-O-(p-fluorobenzenesulfonyl)-nioxime, bis-O-(p-trifluoromethylbenzenesulfonyl)-nioxime, and bis-O-(xylenesulfonyl)-nioxime.

Also included are the oxime sulfonates described in U.S. Pat. No. 6,004,724, for example,
(5-(4-toluenesulfonyl)oxyimino-5H-thiophen-2-ylidene)phenylacetonitrile,
(5-(10-camphorsulfonyl)oxyimino-5H-thiophen-2-ylidene)phenylacetonitrile,
(5-n-octanesulfonyloxyimino-5H-thiophen-2-ylidene)phenylacetonitrile,
(5-(4-toluenesulfonyl)oxyimino-5H-thiophen-2-ylidene)(2-methylphenyl)acetonitrile,
(5-(10-camphorsulfonyl)oxyimino-5H-thiophen-2-ylidene)(2-methylphenyl)acetonitrile, (5-n-octanesulfonyloxyimino-5H-thiophen-2-ylidene)(2-methylphenyl)acetonitrile, etc. Also included are the oxime sulfonates described in U.S. Pat. No. 6,916,591, for example,
(5-(4-(4-toluenesulfonyloxy)benzenesulfonyl)oxyimino-5H-thiophen-2-ylidene)phenylacetonitrile and
(5-(2,5-bis(4-toluenesulfonyloxy)benzenesulfonyl)oxyimino-5H-thiophen-2-ylidene)phenylacetonitrile.

Also included are the oxime sulfonates described in U.S. Pat. No. 6,261,738 and JP-A 2000-314956, for example, 2,2,2-trifluoro-1-phenyl-ethanone oxime-O-methylsulfonate; 2,2,2-trifluoro-1-phenyl-ethanone oxime-O-(10-camphorylsulfonate); 2,2,2-trifluoro-1-phenyl-ethanone oxime-O-(4-methoxyphenylsulfonate); 2,2,2-trifluoro-1-phenyl-ethanone oxime-O-(1-naphthylsulfonate); 2,2,2-trifluoro-1-phenyl-ethanone oxime-O-(2-naphthylsulfonate); 2,2,2-trifluoro-1-phenyl-ethanone oxime-O-(2,4,6-trimethylphenylsulfonate); 2,2,2-trifluoro-1-(4-methylphenyl)-ethanone oxime-O-(10-camphorylsulfonate); 2,2,2-trifluoro-1-(4-methylphenyl)-ethanone oxime-O-(methylsulfonate); 2,2,2-trifluoro-1-(2-methylphenyl)-ethanone oxime-O-(10-camphorylsulfonate); 2,2,2-trifluoro-1-(2,4-dimethylphenyl)-ethanone oxime-O-(10-camphorylsulfonate); 2,2,2-trifluoro-1-(2,4-dimethylphenyl)-ethanone oxime-O-(1-naphthylsulfonate); 2,2,2-trifluoro-1-(2,4-dimethylphenyl)-ethanone oxime-O-(2-naphthylsulfonate); 2,2,2-trifluoro-1-(2,4,6-trimethylphenyl)-ethanone oxime-O-(10-camphorylsulfonate); 2,2,2-trifluoro-1-(2,4,6-trimethylphenyl)-ethanone oxime-O-(1-naphthylsulfonate); 2,2,2-trifluoro-1-(2,4,6-trimethylphenyl)-ethanone oxime-O-(2-naphthylsulfonate); 2,2,2-trifluoro-1-(4-methoxyphenyl)-ethanone oxime-O-methylsulfonate; 2,2,2-trifluoro-1-(4-methylthiophenyl)-ethanone oxime-O-methylsulfonate; 2,2,2-trifluoro-1-(3,4-dimethoxyphenyl)-ethanone oxime-O-methylsulfonate; 2,2,3,3,4,4,4-heptafluoro-1-phenyl-butanone oxime-O-(10-camphorylsulfonate); 2,2,2-trifluoro-1-(phenyl)-ethanone oxime-O-methylsulfonate; 2,2,2-trifluoro-1-(phenyl)-ethanone oxime-O-10-camphorylsulfonate; 2,2,2-trifluoro-1-(phenyl)-ethanone oxime-O-(4-methoxyphenyl)sulfonate; 2,2,2-trifluoro-1-(phenyl)-ethanone oxime-O-(1-naphthyl)sulfonate; 2,2,2-trifluoro-1-(phenyl)-ethanone oxime-O-(2-naphthyl)sulfonate; 2,2,2-trifluoro-1-(phenyl)-ethanone oxime-O-(2,4,6-trimethylphenyl)sulfonate; 2,2,2-trifluoro-1-(4-methylphenyl)-ethanone oxime-O-(10-camphoryl)sulfonate; 2,2,2-trifluoro-1-(4-methylphenyl)-ethanone oxime-O-methylsulfonate; 2,2,2-trifluoro-1-(2-methylphenyl)-ethanone oxime-O-(10-camphoryl)sulfonate; 2,2,2-trifluoro-1-(2,4-dimethylphenyl)-ethanone oxime-O-(1-naphthyl)sulfonate; 2,2,2-trifluoro-1-(2,4-dimethylphenyl)-ethanone oxime-O-(2-naphthyl)sulfonate; 2,2,2-trifluoro-1-(2,4,6-trimethylphenyl)-ethanone oxime-O-(10-camphoryl)sulfonate; 2,2,2-trifluoro-1-(2,4,6-trimethylphenyl)-ethanone oxime-O-(1-naphthyl)sulfonate; 2,2,2-trifluoro-1-(2,4,6-trimethylphenyl)-ethanone oxime-O-(2-naphthyl)sulfonate; 2,2,2-trifluoro-1-(4-methoxyphenyl)-ethanone oxime-O-methylsulfonate; 2,2,2-trifluoro-1-(4-thiomethylphenyl)-ethanone oxime-O-methylsulfonate; 2,2,2-trifluoro-1-(3,4-dimethoxyphenyl)-ethanone oxime-O-methylsulfonate; 2,2,2-trifluoro-1-(4-methoxyphenyl)-ethanone oxime-O-(4-methylphenyl)sulfonate; 2,2,2-trifluoro-1-(4-methoxyphenyl)-ethanone oxime-O-(4-methoxyphenyl)sulfonate; 2,2,2-trifluoro-1-(4-methoxyphenyl)-ethanone oxime-O-(4-dodecylphenyl)-sulfonate; 2,2,2-trifluoro-1-(4-methoxyphenyl)-ethanone oxime-O-octylsulfonate; 2,2,2-trifluoro-1-(4-thiomethyl-phenyl)-ethanone oxime-O-(4-methoxyphenyl)sulfonate; 2,2,2-trifluoro-1-(4-thiomethylphenyl)-ethanone oxime-O-(4-dodecylphenyl)sulfonate; 2,2,2-trifluoro-1-(4-thiomethyl-phenyl)-ethanone oxime-O-octylsulfonate; 2,2,2-trifluoro-1-(4-thiomethylphenyl)-ethanone oxime-O-(2-naphthyl)sulfonate; 2,2,2-trifluoro-1-(2-methylphenyl)-ethanone oxime-O-methylsulfonate; 2,2,2-trifluoro-1-(4-methylphenyl)ethanone oxime-O-phenylsulfonate; 2,2,2-trifluoro-1-(4-chlorophenyl)-ethanone oxime-O-phenylsulfonate; 2,2,3,3,4,4,4-heptafluoro-1-(phenyl)-butanone oxime-O-(10-camphoryl)sulfonate; 2,2,2-trifluoro-1-naphthyl-ethanone oxime-O-methylsulfonate; 2,2,2-trifluoro-2-naphthyl-ethanone oxime-O-methylsulfonate; 2,2,2-trifluoro-1-[4-benzylphenyl]-ethanone oxime-O-methylsulfonate; 2,2,2-trifluoro-1-[4-(phenyl-1,4-dioxa-but-1-yl)phenyl]-ethanone oxime-O-methylsulfonate; 2,2,2-trifluoro-1-naphthyl-ethanone oxime-O-propylsulfonate; 2,2,2-trifluoro-2-naphthyl-ethanone oxime-O-propylsulfonate; 2,2,2-trifluoro-1-[4-benzylphenyl]-ethanone oxime-O-propyl-sulfonate; 2,2,2-trifluoro-1-[4-methylsulfonylphenyl]-ethanone oxime-O-propylsulfonate; 1,3-bis[1-(4-phenoxyphenyl)-2,2,2-trifluoroethanone oxime-O-sulfonyl]phenyl; 2,2,2-trifluoro-1-[4-methylsulfonyloxyphenyl]-ethanone oxime-O-propylsulfonate; 2,2,2-trifluoro-1-[4-methylcarbonyloxyphenyl]-ethanone oxime-O-propylsulfonate; 2,2,2-trifluoro-1-[6H,7H-5,8-dioxonaphth-2-yl]-ethanone oxime-O-propylsulfonate; 2,2,2-trifluoro-1-[4-methoxycarbonylmethoxyphenyl]-ethanone oxime-O-propylsulfonate; 2,2,2-trifluoro-1-[4-(methoxycarbonyl)-(4-amino-1-oxa-pent-1-yl)-phenyl]-ethanone oxime-O-propylsulfonate; 2,2,2-trifluoro-1-[3,5-dimethyl-4-ethoxyphenyl]-ethanone oxime-O-propylsulfonate; 2,2,2-trifluoro-1-[4-benzyloxyphenyl]-ethanone oxime-O-propylsulfonate; 2,2,2-trifluoro-1-[2-thiophenyl]-ethanone oxime-O-propylsulfonate; 2,2,2-trifluoro-1-[1-dioxathiophen-2-yl)]-ethanone oxime-O-propylsulfonate; 2,2,2-trifluoro-1-(4-(3-(4-(2,2,2-trifluoro-1-(trifluoromethanesulfonyloxyimino)-ethyl)-phenoxy)-propoxy)-phenyl)ethanone oxime(trifluoromethanesulfonate); 2,2,2-trifluoro-1-(4-(3-(4-(2,2,2-trifluoro-1-(1-propanesulfonyloxyimino)-ethyl)-phenoxy)-propoxy)-phenyl)ethanone oxime(1-propanesulfonate); and 2,2,2-trifluoro-1-(4-(3-(4-(2,2,2-trifluoro-1-(1-butanesulfonyloxyimino)-ethyl)-phenoxy)-propoxy)-phenyl)ethanone oxime(1-butanesulfonate). Also included are the oxime sulfonates described in U.S. Pat. No. 6,916,591, for example, 2,2,2-trifluoro-1-(4-(3-(4-(2,2,2-trifluoro-1-(4-(4-methylphenylsulfonyloxy)phenylsulfonyloxyimino)-ethyl)-phenoxy)-propoxy)-phenyl)ethanone oxime(4-(4-methylphenylsulfonyloxy)phenylsulfonate) and 2,2,2-trifluoro-1-(4-(3-(4-(2,2,2-trifluoro-1-(2,5-bis(4-methylphenylsulfonyloxy)benzenesulfonyloxy)-phenylsulfonyloxyimino)-ethyl)-phenoxy)-propoxy)-phenyl)ethanone oxime(2,5-bis(4-methylphenylsulfonyloxy)-benzenesulfonyloxy)phenylsulfonate).

Also included are the oxime sulfonates described in JP-A 9-95479 and JP-A 9-230588 and the references cited therein, for example,
α-(p-toluenesulfonyloxyimino)-phenylacetonitrile,
α-(p-chlorobenzenesulfonyloxyimino)-phenylacetonitrile,
α-(4-nitrobenzenesulfonyloxyimino)-phenylacetonitrile,
α-(4-nitro-2-trifluoromethylbenzenesulfonyloxyimino)-phenylacetonitrile,
α-(benzenesulfonyloxyimino)-4-chlorophenylacetonitrile,
α-(benzenesulfonyloxyimino)-2,4-dichlorophenylacetonitrile,
α-(benzenesulfonyloxyimino)-2,6-dichlorophenylacetonitrile, α-(benzenesulfonyloxyimino)-4-methoxyphenylacetonitrile,
α-(2-chlorobenzenesulfonyloxyimino)-4-methoxyphenylacetonitrile,
α-(benzenesulfonyloxyimino)-2-thienylacetonitrile,
α-(4-dodecylbenzenesulfonyloxyimino)-phenylacetonitrile,
α-[(4-toluenesulfonyloxyimino)-4-methoxyphenyl]acetonitrile,
α-[(dodecylbenzenesulfonyloxyimino)-4-methoxyphenyl]acetonitrile,
α-(tosyloxyimino)-3-thienylacetonitrile,
α-(methylsulfonyloxyimino)-1-cyclopentenylacetonitrile,
α-(ethylsulfonyloxyimino)-1-cyclopentenylacetonitrile,
α-(isopropylsulfonyloxyimino)-1-cyclopentenylacetonitrile,
α-(n-butylsulfonyloxyimino)-1-cyclopentenylacetonitrile,
α-(ethylsulfonyloxyimino)-1-cyclohexenylacetonitrile,
α-(isopropylsulfonyloxyimino)-1-cyclohexenylacetonitrile, and
α-(n-butylsulfonyloxyimino)-1-cyclohexenylacetonitrile.

Also included are oxime sulfonates having the formula:

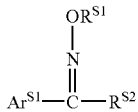

wherein $R^{s1}$ is a substituted or unsubstituted haloalkylsulfonyl or halobenzenesulfonyl group of 1 to 10 carbon atoms, $R^{s2}$ is a haloalkyl group of 1 to 11 carbon atoms, and $Ar^{s1}$ is substituted or unsubstituted aromatic or hetero-aromatic group, as described in WO 2004/074242.

Examples include
2-[2,2,3,3,4,4,5,5-octafluoro-1-(nonafluorobutylsulfonyloxyimino)-pentyl]-fluorene,
2-[2,2,3,3,4,4-pentafluoro-1-(nonafluorobutylsulfonyloxyimino)-butyl]-fluorene,
2-[2,2,3,3,4,4,5,5,6,6-decafluoro-1-(nonafluorobutylsulfonyloxyimino)-hexyl]-fluorene,
2-[2,2,3,3,4,4,5,5-octafluoro-1-(nonafluorobutylsulfonyloxyimino)-pentyl]-4-biphenyl,
2-[2,2,3,3,4,4-pentafluoro-1-(nonafluorobutylsulfonyloxyimino)-butyl]-4-biphenyl, and
2-[2,2,3,3,4,4,5,5,6,6-decafluoro-1-(nonafluorobutylsulfonyloxyimino)-hexyl]-4-biphenyl.

Suitable bisoxime sulfonates include those described in JP-A 9-208554, for example,
bis(α-(4-toluenesulfonyloxy)imino)-p-phenylenediacetonitrile,
bis(α-(benzenesulfonyloxy)imino)-p-phenylenediacetonitrile,
bis(α-(methanesulfonyloxy)imino)-p-phenylenediacetonitrile,
bis(α-(butanesulfonyloxy)imino)-p-phenylenediacetonitrile,
bis(α-(10-camphorsulfonyloxy)imino)-p-phenylenediacetonitrile,
bis(α-(4-toluenesulfonyloxy)imino)-p-phenylenediacetonitrile,
bis(α-(trifluoromethanesulfonyloxy)imino)-p-phenylenediacetonitrile,
bis(α-(4-methoxybenzenesulfonyloxy)imino)-p-phenylenediacetonitrile,
bis(α-(4-toluenesulfonyloxy)imino)-m-phenylenediacetonitrile,
bis(α-(benzenesulfonyloxy)imino)-m-phenylenediacetonitrile,
bis(α-(methanesulfonyloxy)imino)-m-phenylenediacetonitrile,
bis(α-(butanesulfonyloxy)imino)-m-phenylenediacetonitrile,
bis(α-(10-camphorsulfonyloxy)imino)-m-phenylenediacetonitrile,
bis(α-(4-toluenesulfonyloxy)imino)-m-phenylenediacetonitrile,
bis(α-(trifluoromethanesulfonyloxy)imino)-m-phenylenediacetonitrile,
bis(α-(4-methoxybenzenesulfonyloxy)imino)-m-phenylenediacetonitrile, etc.

Of these, preferred photoacid generators are sulfonium salts, bissulfonyldiazomethanes, N-sulfonyloxyimides, oxime-O-sulfonates and glyoxime derivatives. More preferred photoacid generators are sulfonium salts, bissulfonyldiazomethanes, N-sulfonyloxyimides, and oxime-O-sulfonates. Typical examples include
triphenylsulfonium p-toluenesulfonate,
triphenylsulfonium camphorsulfonate,
triphenylsulfonium pentafluorobenzenesulfonate,
triphenylsulfonium nonafluorobutanesulfonate,
triphenylsulfonium 4-(4'-toluenesulfonyloxy)benzenesulfonate,
triphenylsulfonium 2,4,6-triisopropylbenzenesulfonate,
4-tert-butoxyphenyldiphenylsulfonium p-toluenesulfonate,
4-tert-butoxyphenyldiphenylsulfonium camphorsulfonate,
4-tert-butoxyphenyldiphenylsulfonium 4-(4'-toluenesulfonyloxy)benzenesulfonate,
tris(4-methylphenyl)sulfonium camphorsulfonate,
tris(4-tert-butylphenyl)sulfonium camphorsulfonate,
4-tert-butylphenyldiphenylsulfonium camphorsulfonate,
4-tert-butylphenyldiphenylsulfonium nonafluoro-1-butanesulfonate,
4-tert-butylphenyldiphenylsulfonium pentafluoroethyl-perfluorocyclohexanesulfonate,
4-tert-butylphenyldiphenylsulfonium perfluoro-1-octanesulfonate,
triphenylsulfonium 1,1-difluoro-2-naphthyl-ethanesulfonate,
triphenylsulfonium 1,1,2,2-tetrafluoro-2-(norbornan-2-yl)-ethanesulfonate,
bis(tert-butylsulfonyl)diazomethane,
bis(cyclohexylsulfonyl)diazomethane,
bis(2,4-dimethylphenylsulfonyl)diazomethane,
bis(4-(n-hexyloxy)phenylsulfonyl)diazomethane,
bis(2-methyl-4-(n-hexyloxy)phenylsulfonyl)diazomethane,
bis(2,5-dimethyl-4-(n-hexyloxy)phenylsulfonyl)diazomethane,
bis(3,5-dimethyl-4-(n-hexyloxy)phenylsulfonyl)diazomethane,
bis(2-methyl-5-isopropyl-4-(n-hexyloxy)phenylsulfonyl)diazomethane,
bis(4-tert-butylphenylsulfonyl)diazomethane,
N-camphorsulfonyloxy-5-norbornene-2,3-dicarboxylic acid imide,
N-p-toluenesulfonyloxy-5-norbornene-2,3-dicarboxylic acid imide,
2-[2,2,3,3,4,4,5,5-octafluoro-1-(nonafluorobutylsulfonyloxyimino)-pentyl]-fluorene,
2-[2,2,3,3,4,4-pentafluoro-1-(nonafluorobutylsulfonyloxyimino)-butyl]-fluorene, and
2-[2,2,3,3,4,4,5,5,6,6-decafluoro-1-(nonafluorobutylsulfonyloxyimino)-hexyl]-fluorene.

In the chemically amplified resist composition, an appropriate amount of the photoacid generator is, but not limited to, 0.1 to 10 parts, and especially 0.1 to 5 parts by weight per 100 parts by weight of the base resin. Too high a proportion of the photoacid generator may give rise to problems of degraded resolution and foreign matter upon development and resist film peeling. The photoacid generators may be used alone or in admixture of two or more. The transmittance of the resist film can be controlled by using a photoacid generator having a low transmittance at the exposure wavelength and adjusting the amount of the photoacid generator added.

In the resist composition, there may be added a compound which is decomposed with an acid to generate an acid, that is, acid-amplifier compound. For these compounds, reference should be made to J. Photopolym. Sci. and Tech., 8, 43-44, 45-46 (1995), and ibid., 9, 29-30 (1996).

Examples of the acid-amplifier compound include tert-butyl-2-methyl-2-tosyloxymethyl acetoacetate and 2-phenyl-2-(2-tosyloxyethyl)-1,3-dioxolane, but are not limited thereto. Of well-known photoacid generators, many of those compounds having poor stability, especially poor thermal stability exhibit an acid amplifier-like behavior.

In the resist composition, an appropriate amount of the acid-amplifier compound is up to 2 parts, and especially up to 1 part by weight per 100 parts by weight of the base resin. Excessive amounts of the acid-amplifier compound make diffusion control difficult, leading to degradation of resolution and pattern profile.

In addition to the inventive amine compound, one or more of commonly used amine compounds may be employed in the inventive resist composition.

The resist composition of the invention can also be used as a negative working chemically amplified resist composition. The negative resist composition comprises a base resin which is normally alkali soluble, but becomes substantially alkali insoluble under the action of a crosslinker, and an acid crosslinker which induces crosslinkage under the action of an acid.

Typical acid crosslinkers are compounds having at least two hydroxymethyl, alkoxymethyl, epoxy or vinyl ether groups within a molecule. Substituted glycoluril derivatives, urea derivatives, and hexa(methoxymethyl)melamine compounds are suitable as the crosslinker. Examples include N,N,N',N'-tetramethoxymethylurea, hexamethylmelamine, tetrahydroxymethyl-substituted glycoluril compounds, tetraalkoxymethyl-substituted glycoluril compounds such as tetramethoxymethylglycoluril, and condensates of phenolic compounds such as substituted or unsubstituted bis(hydroxymethylphenol) compounds and bisphenol A with epichlorohydrin. Especially preferred crosslinkers are 1,3,5,7-tetraalkoxymethylglycolurils such as 1,3,5,7-tetramethoxymethylglycoluril, 1,3,5,7-tetrahydroxymethylglycoluril, 2,6-dihydroxymethyl-p-cresol, 2,6-dihydroxymethylphenol, 2,2',6,6'-tetrahydroxymethyl-bisphenol A, 1,4-bis[2-(2-hydroxypropyl)]benzene, N,N,N',N'-tetramethoxymethylurea, and hexamethoxymethylmelamine. In the resist composition, an appropriate amount of the crosslinker is, though not limited thereto, about 1 to 25 parts, and especially about 5 to 20 parts by weight per 100 parts by weight of the base resin. The crosslinkers may be used alone or in admixture of two or more.

In addition to the above components, the inventive resist composition may optionally include known additives such as dissolution regulators, surfactants, acidic compounds, dyes, thermal crosslinkers, and stabilizers.

Using the resist composition of the invention, patterns may be formed by any known lithographic technique. Typically, the composition is applied onto a substrate (e.g., Si, $SiO_2$, SiN, SiON, TiN, WSi, BPSG, SOG, organic anti-reflective film, Cr, CrO, CrON, MoSi, etc.) for microfabrication by a suitable coating technique such as spin coating, roll coating, flow coating, dip coating, spray coating or doctor coating. The coating is prebaked on a hot plate at a temperature of 60 to 150° C. for about 0.1 to 10 minutes, preferably 80 to 140° C. for 0.5 to 5 minutes. The resulting resist film is generally 0.05 to 2.0 μm thick. A patterning mask having the desired pattern may then be placed over the resist film, and the resist film is then exposed to radiation, preferably having an exposure wavelength of up to 300 nm, such as UV, deep-UV, electron beam, x-ray, excimer laser light, γ-ray and synchrotron radiation. The exposure dose is preferably in the range of about 1 to 200 mJ/cm$^2$, more preferably about 10 to 100 mJ/cm$^2$. Light exposure may be done by a conventional exposure process or in some cases, by an immersion lithography process of providing a liquid fill, typically water, between the projection lens and the resist. In the case of immersion lithography, if necessary, a topcoat may be applied onto the resist film before exposure, which is generally know as "top coating process." The resist film is then post-exposure baked (PEB) on a hot plate at 60 to 150° C. for 0.1 to 5 minutes, and preferably at 80 to 140° C. for 0.5 to 3 minutes. Finally, development may be carried out using as the developer an aqueous alkali solution, such as 0.1 to 5 wt %, and preferably 2 to 3 wt %, tetramethylammonium hydroxide (TMAH), this being done by a conventional method such as dip, puddle, or spray technique for a period of 0.1 to 3 minutes, and preferably 0.5 to 2 minutes. These steps result in the formation of the desired pattern on the substrate. If necessary, the pattern as developed can be heat treated for adjusting the pattern size, which is generally known as "thermal flow process."

Of the various types of high-energy radiation that may be used, the resist composition of the invention is best suited to micro-pattern formation with, in particular, deep-UV rays having a wavelength of 260 to 120 nm or excimer laser beams, extremely short UV, x-rays or electron beams.

EXAMPLE

Examples of the invention are given below by way of illustration and not by way of limitation. The abbreviation "Ac" denotes acetyl.

Synthesis Examples

Amine compounds within the scope of the invention were synthesized by the methods described below.

Synthesis Example 1

Synthesis of 2,2,3,3,4,4,5,5-octafluoropentyl 3-morpholinopropionate (Amine 1)

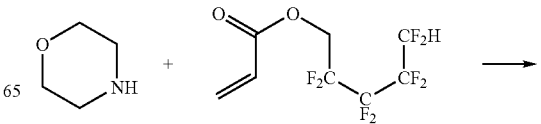

-continued

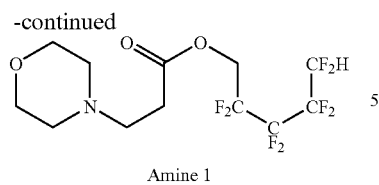

Amine 1

With ice cooling and stirring, 9.6 g of morpholine was added dropwise to 28.6 g of 2,2,3,3,4,4,5,5-octafluoropentyl acrylate. The mixture was stirred for one hour at room temperature, after which it was directly distilled for purification. There was obtained 36.2 g of 2,2,3,3,4,4,5,5-octafluoropentyl 3-morpholinopropionate (boiling point 84° C./13 Pa, yield 97%).

IR (KBr): ν=2964, 2898, 2859, 2817, 2694, 1760, 1459, 1405, 1361, 1295, 1249, 1172, 1118, 1070, 1010, 973, 904, 806, 763 cm$^{-1}$ $^1$H-NMR (600 MHz in CDCl$_3$): δ=2.47 (4H, m), 2.60 (2H, t, J=7.2 Hz), 2.69 (2H, t, J=7.2 Hz), 3.67 (4H, t, J=4.6 Hz), 4.59 (2H, t, J=13.7 Hz), 6.04 (1H, tt, J=52.1, 5.3 Hz)

$^{19}$F-NMR (565 MHz in CDCl$_3$, trifluoroacetic acid standard): δ=−137.9 (2F, m), −130.6 (2F, m), −126.0 (2F, m), −120.4 (2F, m)

Synthesis Example 2

Synthesis of 2-morpholinoethyl 2,2-bis(trifluoromethyl)-propionate (Amine 2)

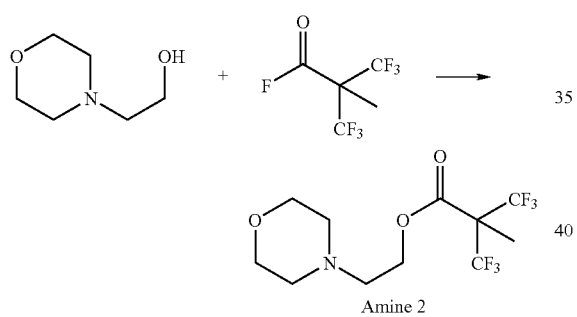

Amine 2

A mixture of 26.2 g of 2-morpholinoethanol, 21.2 g of 2,2-bis(trifluoromethyl)propionic acid fluoride, 20.2 g of triethylamine, and 100 g of acetonitrile was stirred at 60° C. for 20 hours. This was followed by conventional aqueous work-up and purification by silica gel column chromatography. There was obtained 22.6 g of 2-morpholinoethyl 2,2-bis(trifluoromethyl)propionate (yield 70%).

Synthesis Example 3

Synthesis of N-methyl-N-(2-morpholinoethyl)-2,2,3, 3,4,4,5,5,6,6,7,7-dodecafluoroheptaneamide (Amine 3)

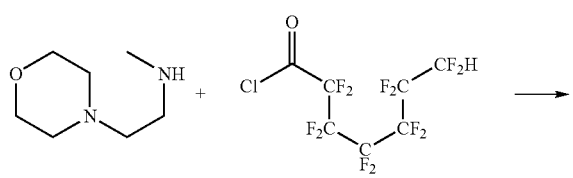

-continued

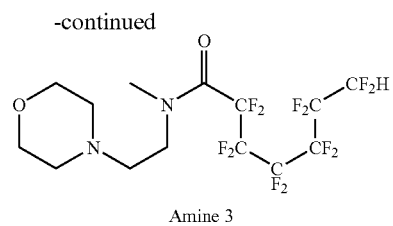

Amine 3

To a mixture of 17.3 g of 4-(2-methylaminoethyl)-morpholine and 100 g of tetrahydrofuran, with ice cooling and stirring, 36.5 g of 7H-dodecafluoroheptanoic acid chloride and 40.0 g of a 10% sodium hydroxide aqueous solution were separately added dropwise each over one hour. The mixture was then stirred at room temperature for a further one hour. This was followed by conventional aqueous work-up and purification by silica gel column chromatography. There was obtained 38.7 g of N-methyl-N-(2-morpholinoethyl)-2,2,3,3, 4,4,5,5,6,6,7,7-dodecafluoroheptaneamide (yield 82%).

Synthesis Example 4

Synthesis of N-methyl-N-(2-morpholinoethyl)-1,1,2, 2,3,3,4,4,4-nonafluoro-1-butanesulfoneamide (Amine 4)

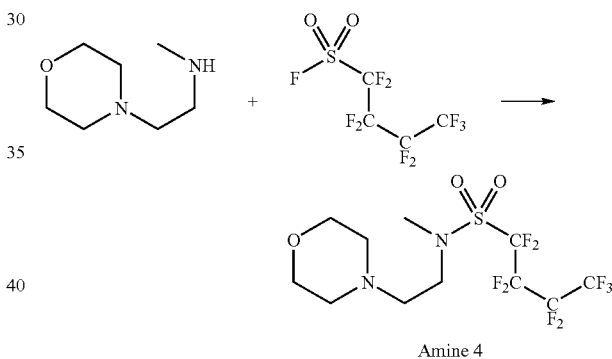

Amine 4

To a mixture of 17.3 g of 4-(2-methylaminoethyl)-morpholine and 100 g of tetrahydrofuran, with ice cooling and stirring, 30.2 g of perfluoro-1-butanesulfonic acid fluoride and 40.0 g of a 10% sodium hydroxide aqueous solution were separately added dropwise each over one hour. The mixture was then stirred at room temperature for a further 2 hours. This was followed by conventional aqueous work-up and purification by silica gel column chromatography. There was obtained 26.4 g of N-methyl-N-(2-morpholinoethyl)-1,1,2,2, 3,3,4,4,4-nonafluoro-1-butanesulfoneamide (yield 62%).

Synthesis Example 5

Synthesis of 1-morpholino-4,4,5,5,6,6,7,7,7-nonafluoro-2-heptanol (Amine 5)

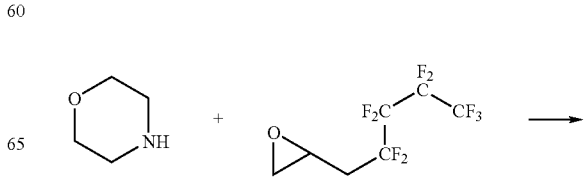

-continued

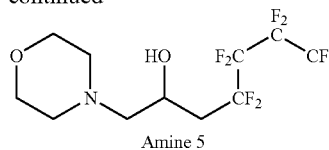
Amine 5

To 8.7 g of morpholine, 27.6 g of 1,2-epoxy-4,4,5,5,6,6,7,7,7-nonafluoroheptane was added dropwise. The mixture was then stirred at 80° C. for 10 hours. The reaction mixture was directly purified by silica gel column chromatography, obtaining 33.8 g of 1-morpholino-4,4,5,5,6,6,7,7,7-nonafluoro-2-heptanol (yield 93%).

Synthesis Example 6

Synthesis of 1-morpholino-4,4,5,5,6,6,7,7,7-nonafluoro-2-heptyl acetate (Amine 6)

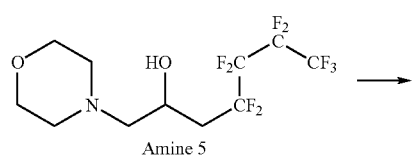
Amine 5

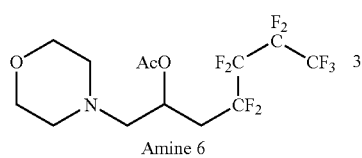
Amine 6

To 36.3 g of 1-morpholino-4,4,5,5,6,6,7,7,7-nonafluoro-2-heptanol was added 11.2 g of acetic anhydride. The mixture was stirred at 50° C. for 10 hours. This was followed by conventional aqueous work-up and purification by silica gel column chromatography. There was obtained 38.5 g of 1-morpholino-4,4,5,5,6,6,7,7,7-nonafluoro-2-heptyl acetate (yield 95%).

Synthesis Example 7

Synthesis of 1-(2-morpholinoethoxy)-4,4,5,5,6,6,7,7,7-nonafluoro-2-heptanol (Amine 7)

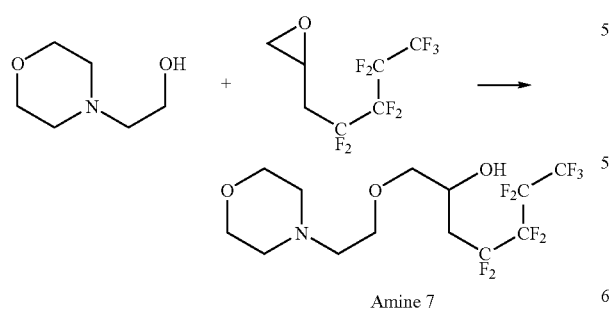
Amine 7

A mixture of 13.1 g of 2-morpholinoethanol and 27.6 g of 1,2-epoxy-4,4,5,5,6,6,7,7,7-nonafluoroheptane was stirred at 80° C. for 10 hours. The reaction mixture was directly purified by silica gel column chromatography. There was obtained 29.7 g of 1-(2-morpholinoethoxy)-4,4,5,5,6,6,7,7,7-nonafluoro-2-heptanol (yield 73%).

Synthesis Example 8

Synthesis of 1-(2-morpholinoethoxy)-4,4,5,5,6,6,7,7,7-nonafluoro-2-heptyl acetate (Amine 8)

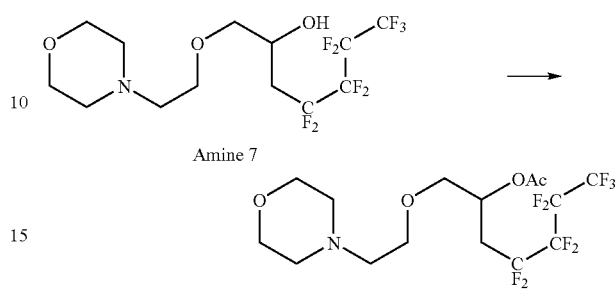
Amine 7

Amine 8

To 40.7 g of 1-(2-morpholinoethoxy)-4,4,5,5,6,6,7,7,7-nonafluoro-2-heptanol was added 11.2 g of acetic anhyride. The mixture was stirred at 50° C. for 10 hours, followed by conventional aqueous work-up and purification by silica gel column chromatography. There was obtained 42.7 g of 1-(2-morpholinoethoxy)-4,4,5,5,6,6,7,7,7-nonafluoro-2-heptyl acetate (yield 95%).

Synthesis Example 9

Synthesis of 1-morpholino-3-(2,2,3,3,4,4,5,5-octafluoro-pentyloxy)-2-propanol (Amine 9)

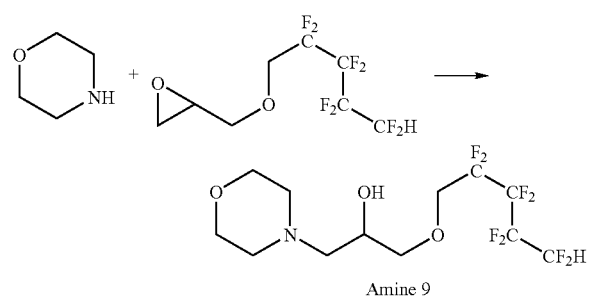
Amine 9

28.8 g of glycidyl 2,2,3,3,4,4,5,5-octafluoropentyl ether was added dropwise to 8.7 g of morpholine. The mixture was then stirred at 80° C. for 10 hours. The reaction mixture was directly purified by silica gel column chromatography. There was obtained 33.4 g of 1-morpholino-3-(2,2,3,3,4,4,5,5-octafluoropentyloxy)-2-propanol (yield 89%).

Synthesis Example 10

Synthesis of 2-morpholino-1-{(2,2,3,3,4,4,5,5-octafluoropentyloxy)methyl}ethyl acetate (Amine 10)

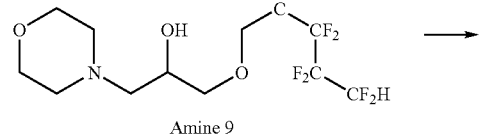
Amine 9

-continued

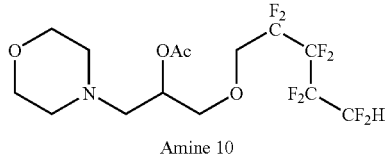

Amine 10

To 37.5 g of 1-morpholino-3-(2,2,3,3,4,4,5,5-octafluoro-pentyloxy)-2-propanol was added 11.2 g of acetic anhyride. The mixture was stirred at 50° C. for 10 hours, followed by conventional aqueous work-up and purification by silica gel column chromatography. There was obtained 39.6 g of 2-morpholino-1-{(2,2,3,3,4,4,5,5-octafluoropentyloxy)-methyl}ethyl acetate (yield 95%).

EXAMPLES

Resist compositions were prepared using amine compounds of the invention. They were evaluated for resolution and pattern profile by carrying out the patterning process of the invention.

The base polymer (Polymers 1 to 2), photoacid generator (PAG1 to 2), and amine (Amines 11 to 13) used in Examples are identified below by their structural formula. Note that PGMEA is propylene glycol monomethyl ether acetate. Weight and number average molecular weights, Mw and Mn, are determined by gel permeation chromatography (GPC) using polystyrene standards.

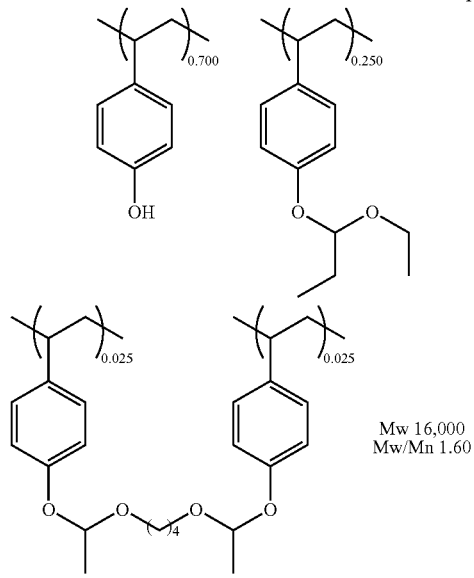

Polymer 1

Mw 16,000
Mw/Mn 1.60

Polymer 2

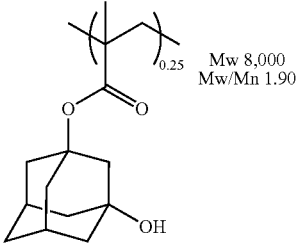

Mw 8,000
Mw/Mn 1.90

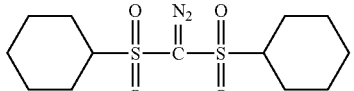

PAG 1

PAG 2

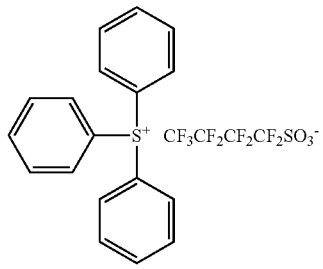

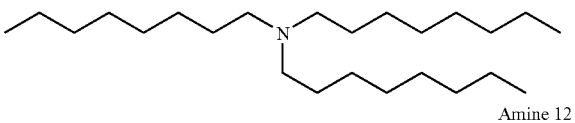

Amine 11

Amine 12

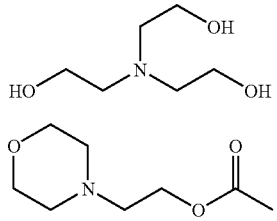

Amine 13

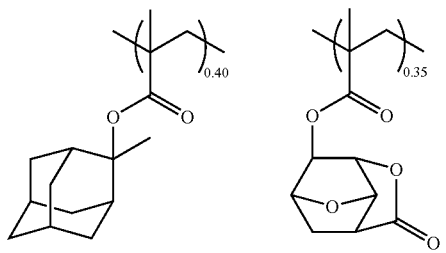

Example 1

A resist composition was prepared by using the amine compound (Amine 1) obtained in Synthesis Example 1, combining it with other components in accordance with the following recipe, and filtering the resulting solution through a Teflon® filter having a pore size of 0.2 µm.

| Components | Parts by weight |
|---|---|
| (A) Base polymer (Polymer 1) | 100 |
| (B) Photoacid generator (PAG1) | 2.0 |
| (C) Solvent | |
| PGMEA | 280 |
| ethyllactate | 120 |
| (D) Amine compound (Amine 1) | 0.1 |

The resulting resist solution was spin-coated onto a silicon wafer substrate having an antireflective film (DUV-30 by Nissan Chemical Industries, Ltd., 55 nm) coated thereon, then baked at 115° C. for 90 seconds, forming a resist film of 550 nm thick. The resist film was exposed using an excimer laser stepper NSR-S203B (by Nikon Corporation; NA 0.68, σ

0.75, ⅔ annular illumination), then heat treated at 110° C. for 90 seconds, cooled to 23° C., and subjected to puddle development with a 2.38 wt % aqueous solution of tetramethylammonium hydroxide at 23° C. for 60 seconds, forming a 1:1 line-and-space pattern. The wafer as developed was observed under a top-down SEM. At the optimum exposure dose which provided a 1:1 resolution of a 0.18 μm line-and-space pattern, a 0.15 μm line-and-space pattern was kept separated and resolved without peeling. A cross section of the resist pattern was also observed to find that the pattern profile was rectangular and perpendicular to the substrate.

Examples 2-10 and Comparative Examples 1-3

Resist compositions were prepared as in Example 1 using the amine compounds (Amines 2 to 10) obtained in Synthesis Examples 2 to 10 and comparative amine compounds (Amines 11 to 13). Note that in Examples and Comparative Examples, amines were used in an equimolar amount to the molar amount calculated from 0.1 pbw of Amine 1. The resist compositions were evaluated for resolution and pattern profile.

Based on the results of these tests, the resolution of the 0.15 μm line-and-space pattern is classified into ratings of passed (○), mediocre (Δ) and rejected (X) as tabulated in Table 1 (Examples and Comparative Examples), with the pattern profile observed being reported together.

TABLE 1

| | Polymer | Photoacid generator | Amine | 0.15 μm resolution | Pattern profile |
|---|---|---|---|---|---|
| Example 1 | Polymer 1 | PAG1 | Amine 1 | ○ | rectangular, perpendicular |
| Example 2 | Polymer 1 | PAG1 | Amine 2 | ○ | rectangular, perpendicular |
| Example 3 | Polymer 1 | PAG1 | Amine 3 | ○ | rectangular, perpendicular |
| Example 4 | Polymer 1 | PAG1 | Amine 4 | ○ | rectangular, perpendicular |
| Example 5 | Polymer 1 | PAG1 | Amine 5 | ○ | rectangular, perpendicular |
| Example 6 | Polymer 1 | PAG1 | Amine 6 | ○ | rectangular, perpendicular |
| Example 7 | Polymer 1 | PAG1 | Amine 7 | ○ | rectangular, perpendicular |
| Example 8 | Polymer 1 | PAG1 | Amine 8 | ○ | rectangular, perpendicular |
| Example 9 | Polymer 1 | PAG1 | Amine 9 | ○ | rectangular, perpendicular |
| Example 10 | Polymer 1 | PAG1 | Amine 10 | ○ | rectangular, perpendicular |
| Comparative Example 1 | Polymer 1 | PAG1 | Amine 11 | X | — |
| Comparative Example 2 | Polymer 1 | PAG1 | Amine 12 | Δ | rounded top, somewhat tapered |
| Comparative Example 3 | Polymer 1 | PAG1 | Amine 13 | ○ | somewhat rounded top, perpendicular |

Example 11

A resist composition was prepared by using the amine compound (Amine 1) obtained in Synthesis Example 1, combining it with other components in accordance with the following recipe, and filtering the resulting solution through a Teflon® filter having a pore size of 0.2 μm.

| Components | Parts by weight |
|---|---|
| (A) Base polymer (Polymer 2) | 80 |
| (B) Photoacid generator (PAG2) | 2.0 |
| (C) Solvent (PGMEA) | 640 |
| (D) Amine compound (Amine 1) | 0.25 |

The resulting resist solution was spin-coated onto a silicon wafer substrate having an antireflective film (ARC29A by Nissan Chemical Industries, Ltd., 78 nm) coated thereon, then baked at 120° C. for 60 seconds, forming a resist film of 300 nm thick. The resist film was exposed using an ArF excimer laser stepper NSR-S305B (by Nikon Corporation; NA 0.68, σ 0.85, ⅔ annular illumination), then heat treated at 120° C. for 60 seconds, cooled to 23° C., and subjected to puddle development with a 2.38 wt % aqueous solution of tetramethylammonium hydroxide at 23° C. for 60 seconds, forming a 1:1 line-and-space pattern. The wafer as developed was observed under a top-down SEM. At the optimum exposure dose which provided a 1:1 resolution of a 0.12 μm line-and-space pattern, a 0.12 μm line-and-space pattern was kept separated and resolved without peeling. A cross section of the resist pattern was also observed to find that the pattern profile was rectangular and perpendicular to the substrate.

Examples 12-20 and Comparative Examples 4-6

Resist compositions were prepared as in Example 11 using the amine compounds (Amines 2 to 10) obtained in Synthesis Examples 2 to 10 and comparative amine compounds (Amines 11 to 13). Note that in Examples and Comparative Examples, amines were used in an equimolar amount to the molar amount calculated from 0.25 pbw of Amine 1. The resist compositions were evaluated for resolution and pattern profile.

Based on the results of these tests, the resolution of the 0.12 μm line-and-space pattern is classified into ratings of passed (○), mediocre (Δ) and rejected (X) as tabulated in Table 2 (Examples and Comparative Examples), with the pattern profile observed being reported together.

TABLE 2

| | Polymer | Photoacid generator | Amine | 0.15 μm resolution | Pattern profile |
|---|---|---|---|---|---|
| Example 11 | Polymer 2 | PAG2 | Amine 1 | ○ | rectangular, perpendicular |
| Example 12 | Polymer 2 | PAG2 | Amine 2 | ○ | rectangular, perpendicular |
| Example 13 | Polymer 2 | PAG2 | Amine 3 | ○ | rectangular, perpendicular |
| Example 14 | Polymer 2 | PAG2 | Amine 4 | ○ | rectangular, perpendicular |
| Example 15 | Polymer 2 | PAG2 | Amine 5 | ○ | rectangular, perpendicular |
| Example 16 | Polymer 2 | PAG2 | Amine 6 | ○ | rectangular, perpendicular |
| Example 17 | Polymer 2 | PAG2 | Amine 7 | ○ | rectangular, perpendicular |
| Example 18 | Polymer 2 | PAG2 | Amine 8 | ○ | rectangular, perpendicular |
| Example 19 | Polymer 2 | PAG2 | Amine 9 | ○ | rectangular, perpendicular |
| Example 20 | Polymer 2 | PAG2 | Amine 10 | ○ | rectangular, perpendicular |
| Comparative Example 4 | Polymer 2 | PAG2 | Amine 11 | X | — |

TABLE 2-continued

| | Polymer | Photoacid generator | Amine | 0.15 µm resolution | Pattern profile |
|---|---|---|---|---|---|
| Comparative Example 5 | Polymer 2 | PAG2 | Amine 12 | Δ | somewhat rounded top, somewhat tapered |
| Comparative Example 6 | Polymer 2 | PAG2 | Amine 13 | ○ | rounded top, perpendicular |

Reference Examples 1 to 10 and Comparative Reference Examples 1 and 2

Water Extraction Test of Amine Additive

Each of resist solutions prepared in Examples 11 to 20 and Comparative Examples 5 and 6 and filtered through a 0.2-µm filter was coated onto a 8-inch wafer and baked at 120° C. for 60 seconds to form a resist film of 300 nm thick. Deionized water, 20 mL, was dispensed and held on the resist film for 5 minutes, after which the water was recovered. The water was concentrated 10 folds in volume while flowing nitrogen at room temperature. The amount of amine in the concentrate was quantified by capillary electrophoresis/mass spectroscopy (Agilent Technologies, CE-MS system G1600A). The measured value was converted to a value prior to the concentration. The results are shown in Table 3.

TABLE 3

| | Resist | Amine | Water extracted amine (ppb) |
|---|---|---|---|
| Reference Example 1 | Example 11 | Amine 1 | ≦0.1 |
| Reference Example 2 | Example 12 | Amine 2 | ≦0.1 |
| Reference Example 3 | Example 13 | Amine 3 | ≦0.1 |
| Reference Example 4 | Example 14 | Amine 4 | ≦0.1 |
| Reference Example 5 | Example 15 | Amine 5 | ≦0.1 |
| Reference Example 6 | Example 16 | Amine 6 | ≦0.1 |
| Reference Example 7 | Example 17 | Amine 7 | ≦0.1 |
| Reference Example 8 | Example 18 | Amine 8 | ≦0.1 |
| Reference Example 9 | Example 19 | Amine 9 | ≦0.1 |
| Reference Example 10 | Example 20 | Amine 10 | ≦0.1 |
| Comparative Reference Example 1 | Comparative Example 5 | Amine 12 | 3.5 |
| Comparative Reference Example 2 | Comparative Example 6 | Amine 13 | 2.4 |

It is seen from the above results that the resist compositions within the scope of the invention are improved in resolution and pattern profile. Since the leaching of amine into water from the resist film is minimized, the resist compositions are believed compliant with the immersion lithography.

Japanese Patent Application No. 2005-299558 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified resist composition comprising at least one member selected from amine compounds having a fluorinated alkyl group and a morpholine structure, represented by the general formulae (1) to (7):

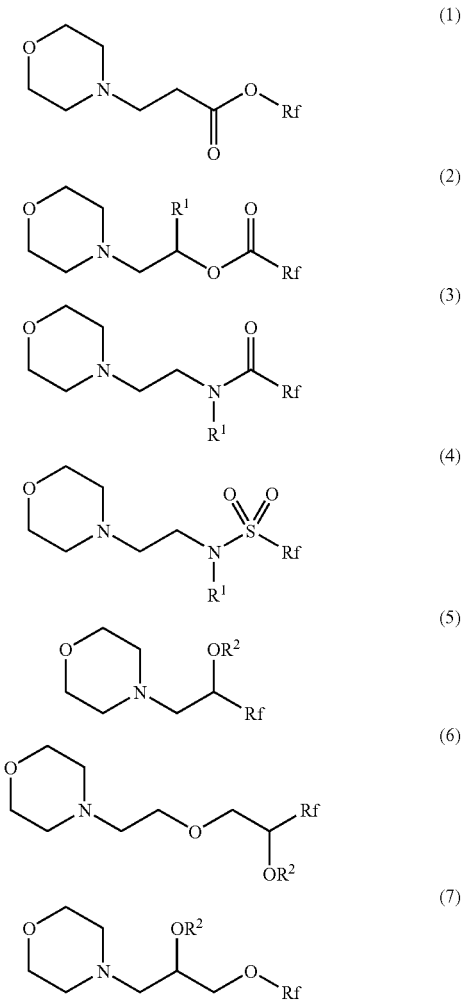

wherein Rf is a straight, branched or cyclic alkyl group of 1 to 20 carbon atoms in which some or all hydrogen atoms are substituted by fluorine atoms, $R^1$ is hydrogen or methyl, and $R^2$ is hydrogen or a straight, branched or cyclic acyl group of 1 to 10 carbon atoms in which some or all hydrogen atoms may be substituted by fluorine atoms.

2. A chemically amplified resist composition comprising
(A) at least one amine compound having a fluorinated alkyl group and a morpholine structure,
(B) an organic solvent,
(C) a base resin having acid labile group-protected acidic functional groups which is alkali-insoluble or substantially alkali-insoluble, but becomes alkali-soluble when the acid labile groups are eliminated, and
(D) a photoacid generator,
said amine compound (A) being selected from compounds represented by the general formulae (1) to (7):

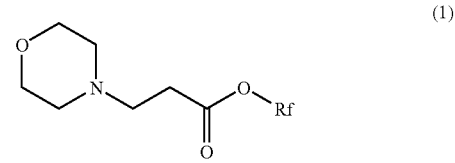

-continued

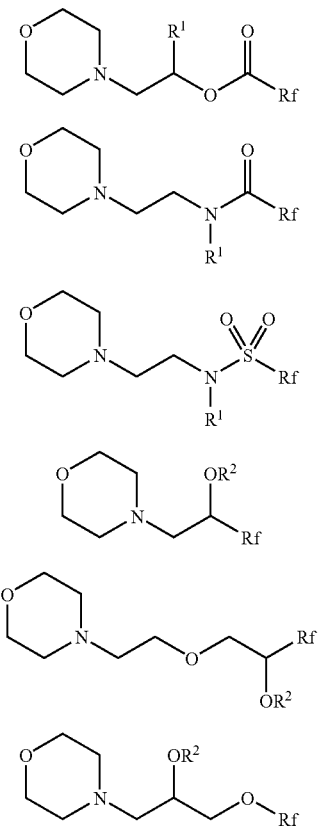

wherein Rf is a straight, branched or cyclic alkyl group of 1 to 20 carbon atoms in which some or all hydrogen atoms are substituted by fluorine atoms, $R^1$ is hydrogen or methyl, and $R^2$ is hydrogen or a straight, branched or cyclic acyl group of 1 to 10 carbon atoms in which some or all hydrogen atoms may be substituted by fluorine atoms.

3. A patterning process comprising the steps of:
(1) applying the chemically amplified resist composition of claim 1 or 2 onto a substrate;
(2) heat treating the applied resist, then exposing the heat-treated resist through a photomask to high-energy radiation having a wavelength of up to 300 nm or an electron beam; and
(3) heat treating the exposed resist, then developing the resist with a liquid developer.

4. A patterning process comprising the steps of:
(1) applying the chemically amplified resist composition of claim 2 onto a substrate;
(2) heat treating the applied resist, then exposing the heat-treated resist though a photomask to high-energy radiation having a wavelength of up to 300 nm or an electron beam; and
(3) heat treating the exposed resist, then developing the resist with a liquid developer.

5. An amine compound selected from amine compounds having a fluorinated alkyl group and a morpholine structure, represented by the general formulae (1)-(4), (6) and (7):

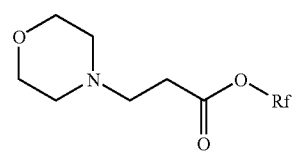

(1)

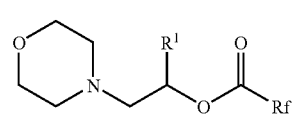

(2)

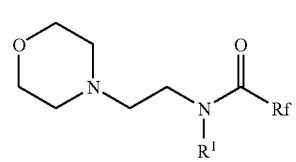

(3)

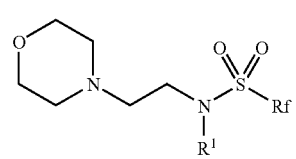

(4)

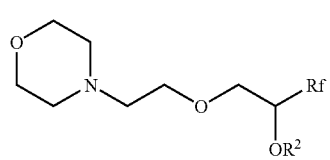

(6)

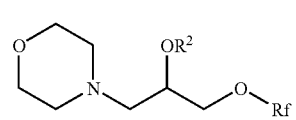

(7)

wherein Rf is a straight, branched or cyclic alkyl group of 1 to 20 carbon atoms in which some or all hydrogen atoms are substituted by fluorine atoms, $R^1$ is hydrogen or methyl, and $R^2$ is hydrogen or a straight, branched or cyclic acyl group of 1 to 10 carbon atoms in which some or all hydrogen atoms may be substituted by fluorine atoms.

* * * * *